United States Patent [19]

Watanabe

[11] Patent Number: 5,554,465
[45] Date of Patent: Sep. 10, 1996

[54] PROCESS FOR FORMING A PATTERN USING A RESIST COMPOSITION HAVING A SILOXANE-BOND STRUCTURE

[75] Inventor: Hisashi Watanabe, Kyoto, Japan

[73] Assignee: Matsushita Electronics Corporation, Osaka, Japan

[21] Appl. No.: 448,100

[22] Filed: May 23, 1995

Related U.S. Application Data

[62] Division of Ser. No. 304,086, Sep. 9, 1994, which is a continuation of Ser. No. 135,952, Oct. 13, 1993, Pat. No. 5,378,585, which is a continuation of Ser. No. 719,188, Jun. 21, 1991, abandoned.

[30] Foreign Application Priority Data

Jun. 25, 1990 [JP] Japan .................................. 2-167173

[51] Int. Cl.$^6$ ........................ G03C 1/00; G03C 1/72; G03F 7/075
[52] U.S. Cl. .................... 430/5; 430/270.1; 430/313; 430/176; 430/192; 430/916; 430/925; 430/927
[58] Field of Search ...................... 430/270, 313, 430/176, 192, 916, 925, 927, 270.1, 5

[56] References Cited

U.S. PATENT DOCUMENTS

| | | | |
|---|---|---|---|
| 3,779,778 | 12/1973 | Smith et al. | 430/270 |
| 4,442,197 | 4/1984 | Criuello et al. | 430/270 |
| 4,491,628 | 1/1985 | Ito et al. | 430/176 |
| 4,665,006 | 5/1987 | Sachdev et al. | 430/313 |
| 4,722,881 | 2/1988 | Ueno et al. | 430/192 |
| 5,158,854 | 10/1992 | Imamura et al. | 430/192 |
| 5,378,585 | 1/1995 | Watanabe | 430/176 |
| 5,389,492 | 2/1995 | Kokubo et al. | 430/192 |
| 5,422,223 | 6/1995 | Sachdev et al. | 430/313 |

FOREIGN PATENT DOCUMENTS

| | | |
|---|---|---|
| 0076656 | 4/1983 | European Pat. Off. . |
| 0090924 | 10/1983 | European Pat. Off. . |
| 0315954 | 5/1989 | European Pat. Off. . |
| 0422570 | 4/1991 | European Pat. Off. . |
| 59-68735 | 4/1984 | Japan . |
| 60-52845 | 3/1985 | Japan . |
| 62-50811 | 3/1987 | Japan . |
| 62-59296 | 12/1987 | Japan . |
| 63-46094 | 9/1988 | Japan . |
| 63-236028 | 9/1988 | Japan . |
| 63-279245 | 11/1988 | Japan . |
| 2-15863 | 4/1990 | Japan . |
| 2-15864 | 4/1990 | Japan . |

OTHER PUBLICATIONS

EPO Search Report in Application 91110509.6 dated Jul. 6, 1992.

M. Cagan et al., "A Photo–Patternable Stress Relief Material for Plastic Packaged Integrated Circuits", *IEEE Transactions on Components Hybrids, and Manufacturing Technology*, vol. 11, No. 4, pp. 611–617 (Dec. 1988).

R. G. Brault, et al., "Bilevel Polysiloxane Resist for Ion-Beam and Electron–Beam Lithography", *SPIE Advances in Resist Technology and Processing II*, vol. 539, pp. 70–73 (1985).

Y. Saotome et al., "A Silicon Containing Positive Photoresist (SIPR) for a Bilayer Resist System", *J. Electrochem Society*, vol. 132, No. 4, pp. 909–913 (1985).

S. Imamura et al., "A New Silicone–Based Positive Photoresist (SPP) for a Two–Layer Resist System", *SPIE Advances in Resist Technology and Processing V*, vol. 920, pp. 291–294 (1988).

(List continued on next page.)

*Primary Examiner*—Mark F. Huff
*Attorney, Agent, or Firm*—Ratner & Prestia

[57] ABSTRACT

The present invention provides a composition having sensitivity to light or radiation. The composition comprises a polymer having a siloxane-bond structure which undergoes polymerization reaction when irridiated with light or radiation, and a sensitizing agent. The present invention also provides a process for forming a pattern, preparing a photomask and a semiconductor device by using the composition of the present invention.

16 Claims, 13 Drawing Sheets

OTHER PUBLICATIONS

F. Buiguez, et al., "A New Positive Optical Resist for Bilayer Resist Systems", *Microcircuit Engineering,* pp. 471–481 (1985).

A. Steinmann, "Heat Developable Resist for Multilayer Resist Technology", *SPIE Advances in Resist Technology and Processing V,* vol. 920, pp. 13–20 (1988).

2 Partial translation Examiner's Report in R.O.C. Application No. 80104934 dated May 22, 1992.

M. Morita, et al., "High Resolution Double Layer Resist System Using New Silicone Based Negative Resist (SNR)", *Japanese Journal of Applied Physics,* vol. 22, No. 10, pp. L659–L660 (Oct. 1983).

$R_2$: H OR $CH_3$
$R_1$: $OCH_2Si(CH_3)_3$

PROCESS FOR FORMING A PATTERN USING A RESIST COMPOSITION HAVING A SILOXANE-BOND STRUCTURE

This application is a division of application Ser. No. 08/304,086, filed Sep. 9, 1994, (status: pending) which is a continuation of application Ser. No. 08/135,952, filed Oct. 13, 1993, now U.S. Pat. No. 5,378,585, which is a continuation of application Ser. No. 07/719,188, filed Jun. 21, 1991, now abandoned.

BACKGROUND OF THE INVENTION

1. Field of the Invention

The present invention relates to a composition having sensitivity to light or radiation, wherein the term "light" or "radiation" hereinafter represents visible light, ultraviolet rays, far ultraviolet rays, X-rays, and electron beam, or an ion beam, a process for forming a pattern, a method for preparing a photomask, and a method for manufacturing a semiconductor device by using the same.

2. Description of the Prior Art

There has arisen a demand for the formation of a predetermined fine resist pattern in the lithography process because of the tendency toward miniatuarization of semiconductor devices in recent years. In the lithography process, a resist film applied to a substrate is exposed to light through a mask possessing light non-transmissive portions and light transmissive portions. In this process, light is emitted from an exposure and reduction projection apparatus, through a pattern on a mask which is reduced by means of a lens, and then transfers such a pattern to the resist film.

FIG. 16(a) represents the chemical formula of the main component of a conventional resist.

The above resist material is mainly compose of a polymer material soluble in an alkali aqueous solution such as novolak resin or phenol resin. In addition to this polymer, a sensitizing agent such as a naphthoquinonediazide compound is mixed therein to provide a resist material having sensitivity to light or radiation. For this resist material, an alkali aqueous solution, mainly, several percent ammonium hydroxide aqueous solution, is used as a developer. When irradiated with light or radiation, the naphtoquinone compound as a sensitizing agent produces a carboxylic acid which dissolves in an alkali aqueous solution as a developer to form a resist pattern. Consequently, the resist material which contains a naphtoquinone compound may serve as a positive type of resist material.

However, since the above resist material having sensitivity to light or radiation has low sensitivity as a resist, it needs to be irradiated with a relatively large amount of light or radiation so as to become soluble in a developer. The entails a deficiency in that the formation of the desired resist pattern requires the resist material to be irradiated with light or radiation for a relatively long period of time. Since the resist material has high absorbance to ultraviolet rays, it has another deficiency of being unsuitable for lithography with the use of light with a shorter wavelength such as far ultraviolet rays.

In order to overcome the above deficiencies, a resist which is referred to as a chemically sensitizable resist has been developed. The material for this resist comprises a sensitizing compound which produces an acid when irradiated with light or radiation (an acid producing agent), and a compound which undergoes a chemical reaction under the presence of an acid. Therefore, the dissolving rate of the resist in a developer is not directly changed by the presence of an acid resulting from an acid producing agent irradiated with light or radiation as a sensitizing agent, but changed by the reaction of other resist components catalyzed by the resulting acid. In such a resist, the change in a sensitizing agent induced when irradiated with light or radiation is amplified by catalysis of the acid, thereby making a resist having high sensitivity.

Such a chemically sensitizable resist is described in U.S. Pat. No. 4,491,628. The resist comprises a tert-butyl ester polymer as a main component and onium salt as an acid producing agent. FIG. 16(b) shows an example of the chemical formula of the components of the resist which uses tert-butoxycarbonyloxystyrene as tert-butyl ester, and triphenylsulfonium fluorouantimonate as an acid producing agent. In this resist, when irradiated with light or radiation, the onium salt produces an acid which catalyzes hydrolysis of tert-butyl ester, thereby changing the property of the irradiated portions of a resist film from lipophilic property to hydrophilic property. Consequently, the irradiated portions of the resist film dissolves in a developer to form a resist pattern.

However, because of the trend for a fine structure in semiconductor devices in recent years, a fine resist pattern cannot be formed on a substrate with a large difference in level even by the use of the above chemically sensitizable resist.

For overcoming such a deficiency, multilayer resist methods have been developed. In these methods, a thick organic film is formed on a substrate to level the uneven surface of the substrate, on which a thin resist film is provided, after which the resist film is irradiated with light or radiation to form a resist pattern. Thereafter, by the use of the resist pattern as a mask, the lower thick organic film is etched by means of dry etching, thereby transferring the resist pattern to the organic film. According to these multi-layer resist methods, the resolving power of the resist can be maintained, and prevented from decreasing due to the variety of the depth of focus, thereby forming a fine resist pattern on the substrate with a large difference in level. Examples of multilayer resist methods include two methods as follows:

One is a three-layer resist method, wherein in order to transfer a resist pattern to a lower thick organic film, an intermediate layer such as a silicon dioxide film having a resistance to dry etching with oxygen is interposed between the lower thick organic film and the upper resist film.

Another is a two-layer resist method, wherein a material having a resistance to dry etching with oxygen serves as an upper resist film.

The later two-layer resist method is more promising because of its easier process as compared to the former three-layer resist method. Most of the resist materials used in the two-layer method contains silicon. Since silicon is stable to oxygen plasma for use in dry etching, the silicon-containing resist film is scarcely removed by etching. Consequently, only the lower thick organic film can be etched by oxygen plasma through a silicon-containing resist pattern as a mask, thereby transferring a resist pattern with high resolution to the organic film.

The silicon-containing resists used in the two-layer resist method may be classified into three kinds as follows: (1) a polymerizable one-component resist, (2) a two-component resist containing a naphthoquinone compound as a sensitizing agent, and (3) a chemically sensitizable resist.

(1) An example of a polymerizable one-component resist containing silicon is described in Jpn. J. Appl. Phys. (pages L659–660, vol. 22, 1983, by M. Morita, et.al.), which is an SNR (Silicon-based Negative Resist) having polysiloxane bonds as shown in FIG. 17(a). This resist has sensitivity to an electron beam and far ultraviolet rays as a negative type of resist. The sensitivity to an electron beam is 4.5 µC/cm². An organic solvent such as a mixed solvent containing diisobutylketone and cyclohexanone is used as a developer. In addition to this resist, many polymerizable one-component resists containing silicon have been developed. For example, it has been reported in SPIE (pages 70–63, vol. 639, 1985, by R. G. Brault, R. L. Kubena and R. A. Metzger) that polysilsesquioxane having a trimethylsilyl group as an end group thereof as shown in FIG. 17(b) may serve as the one-component resist. The sensitivity to an electron beam of this resist is 40 µC/cm². An organic solvent such as ethyleneglycolmonoethylether is used as a developer.

(2) An example of a two-component resist comprising a naphthoquinone compound as a sensitizing agent and a silicon-containing resin which is soluble in an alkali solution as a base polymer is described in J. Electrochem. Soc. (pages 903–913, vol. 132, 1985, by Y. Saotomo, et al.), which comprises, for example, a novolak resin that contains a trimethylsilylmethyl group shown in FIG. 17(c) as a base polymer and a naphthoquinone compound also shown in FIG. 17(c) as a sensitizing agent. Since the base polymer has a hydroxyl group, the resist is soluble in an alkali aqueous solution. Therefore, an alkali aqueous solution such as a solution of tetramethylammonium hydroxide (TMAH) is used as a developer.

FIG. 17(d) shows a resist described in SPIE (pages 192–294, vol. 920, 1988, by S. Imamura et al.), which comprises acetylated polyphenylsilsesquioxane as a base polymer, which is also soluble in an alkali aqueous solution. Consequently, the resist may serve as a positive type of resist which may be developed by the use of an alkali aqueous solution by adding a naphthoquinone compound as a sensitizing agent thereto. The sensitivity to ultraviolet rays of the resist is 100 mJ/cm² for a g-line, and 40 mJ/cm² for an i-line.

In addition to these resists, many resists have been developed which comprises a naphthoquinone compound as a sensitizing agent, and a silicon-containing resin which is soluble in an alkali solution as a base polymer. These resists are characterized in that they can be developed by an alkali solution and have a sensitivity of almost 100 mJ/cm² because of the presence of a naphthoquinone compound as a sensitizing agent.

(3) The chemically sensitizable resist has high sensitivity and therefore it can form a resist pattern with high resolution. An example of a resist is described in Japanese Laid-Open Patent Publication No. 60-52845. A resist comprising a compound that produces a cation or an anion when irradiated with light or radiation as a sensitizing agent, and a resin that reacts with the resulting cation or anion moiety to release a silyl group therefrom as a base polymer is known. An example of the main component of this resist is shown in FIG. 16(e), which comprises onium salt as the compound that produces an acid when irradiated with light or radiation, and polytrimethylsiloxystyrene as the polymer which releases a silyl group therefrom.

An example of a resist having the same structure as stated above is described in Proc. Microcircuit Engineering (page 471, 1984, by F. Buiguez, et.al.), which has sensitivity to ultraviolet rays (wavelength: 436 nm) due to the addition of perylene ($C_{20}H_{12}$) as a sensitizer. FIG. 17(f) further shows a resist described in SPIE (pages 13–20, vol. 920, 1988, by A. Steinmann et.al.), which comprises onium salt as the compound that produces an acid when irradiated with light or irradiation, and polytrimethylsilylphthalaldehyde as a base polymer. Since the onium salt has sensitivity only to far ultraviolet rays (<300 nm), perylene is added to this resist material as a sensitizer so that the resist may have sensitivity to a g-line (436 nm).

However, the above silicon-containing resists have deficiencies as described below.

(1) In the case of a polymerizable one-component resist, an organic solvent is used as a developer in a process of development after exposure. At present, the development by the use of an organic solvent as a developer requires higher cost than that by the use of an alkali aqueous solution as a developer for conventional photoresists. While an alkali developer after dilution with water will not adversely affect human, an organic solvent is insoluble in water, and requires large-scale equipment for decomposition. These entail problems associated with safety in the operation thereof and pollution.

In development by the use of an organic solvent as a developer, the developer penetrates the remaining portions of a resist corresponding to a resist pattern, this makes the resist swollen, thereby lowering the resolution of the resist pattern.

(2) A two-components resist comprising a naphthoquinone compound as a sensitizing agent and a silicon-containing resin which is soluble in an alkali solution as a base polymer can be developed by the use of an alkali aqueous solution. However, since this resist comprises the same naphthoquinone compound as that in conventional photoresists as a sensitizing agent, it has the same level of sensitivity to light as conventional photoresists, which is difficult to be raised.

Since the naphthoquinone compound also has high absorbance to light of short wavelength, the resist is not suitable for lithography by the use of light of short wavelength. The resolution of this kind of conventional resists is not entirely satisfactory, because the dissolving rate of the silicon-containing resin in an alkali solution of a developer has not been optimized.

(3) The chemically sensitizable resists containing silicon has a deficiency in that the resist pattern is also etched with an lower layer during an etching process because of the small content of silicon in the resist. FIG. 9 shows the relationship between the silicon content of the upper resist film and the selection ratio of the etched lower resist film to the etched upper resist film. The data in FIG. 9 is plotted, with the silicon content as abscissa and the selection ratio as the ordinate. When no silicon is contained, the selection ratio with respect to dry etching is zero, indicating that etching of the upper resist film proceeds. With an increase in the silicon content of the upper resist film, the selection ratio increases, thereby improving the resolution of a transfered resist pattern. The silicon content of polytrimethylsiloxystyrene shown in FIG. 17(e) is 14%, and the silicon content of polytrimethylsilylphthalaldehyde shown in FIG. 17(f) is 20%. However, both silicon contents are not sufficient to obtain high resolution, thereby requiring the use of a base polymer having higher silicon content.

SUMMARY OF THE INVENTION

The composition having sensitivity to light or radiation of this invention, which overcomes the above-discussed and numerous other disadvantages and deficiencies of the prior art, comprises:

a base polymer consisting essentially of a polymer having a siloxane-bond structure; and a sensitizing agent.

In a preferred embodiment, the polymer having a siloxane-bond structure undergoes polymerization reaction when irradiated with light or radiation.

In a preferred embodiment, the polymer having a siloxane bond structure has at least one end group or said chain group which undergoes condensation polymerization produced from the sensitizing agent by exposure to light or radiation.

In a preferred embodiment, the polymer having a siloxane-bond structure undergoes condensation polymerization by catalysis of an acid or a radical.

A composition having sensitivity to light or radiation, comprises:

a base polymer consisting essentially of a polymer having a siloxane-bond structure, a sensitizing agent, and dyes having high solubility in a polar solvent.

A process for forming a pattern, comprises the steps of:

forming a smoothing layer on a substrate;

applying a composition having sensitivity to light or radiation of the present invention to the smoothing layer to form a resist film;

exposing of predetermined portions of the resist film to light or radiation; and developing the resist film by the use of an alkali developer.

A method for preparing a photomask comprises the steps of:

applying a light non-transmissive pattern on a surface of a substrate, applying a composition of the present invention over the surface of the substrate with said shading pattern to form a resist film, exposing a predetermined portion of the resist film to light or radiation, developing the resist film by the use of a developer, resulting in a phase shifter.

A method for preparing a photomask which further comprises:

The step of subjecting the phase shifter to a heating treatment to complete a polymerization reaction of the polymer contained in the composition of the present invention.

A method for manufacturing a semiconductor device, comprises the steps of:

forming a semiconductor element on a substrate;

forming a plurality of bonding pads on part of the substrate;

forming a protective film to cover the entire surface of the substrate, subjecting the protective film to an etching treatment to form windows on the portions of the protective film facing the individual bonding pads, applying the composition of the present invention to the entire surface of the protective film, including the bonding pads, resulting a resist film, exposing the resist film to light or radiation, developing the resist film by the use of a developer, and connecting the individual bonding pads to wires.

Thus, the invention described herein makes possible the objectives of:

(1) providing a composition having sufficient sensitivity to light or radiation which is suitable for lithography by the use of light of short wavelength such as far ultraviolet rays;

(2) providing a composition having sensitivity to light or radiation which has high resolving power of a resist and can form a fine resist pattern even on a substrate with a large difference in level, (3) providing a composition having sensitivity to light or radiation which can be developed by the use of a developer which is inexpensive, readily decomposed, safe for the handling thereof, and will not cause pollution, (4) providing a composition having sensitivity to light or radiation of which the resolution of a resist pattern will not decrease due to swelling during development after exposure, (5) providing a composition having sensitivity to light or radiation which has small absorbance to light of short wavelength, and (6) providing a composition having sensitivity to light or radiation of which a resist pattern will not be etched during a process of etching and may transfer the resist pattern with high resolution.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The composition having sensitivity to light or radiation of the present invention will now be described.

The composition having sensitivity to light or radiation of the present invention comprises a base polymer consisting essentially of a polymer having a siloxane-bond structure and a sensitizing agent. In the present invention, the term "light" or "radiation" includes visible light, ultraviolet rays, far ultraviolet rays, vacuum ultraviolet rays, X-rays, gamma rays, an electron beam, an ion beam, etc.

Figure 1A:
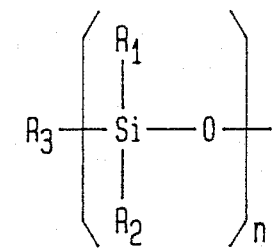
FIGS. 1(a) to 1(c) show diagrams representing the structures of polymer having a siloxane-bond structure.
Figure 1B:
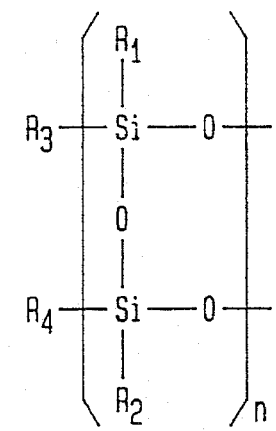
Figure 1C:
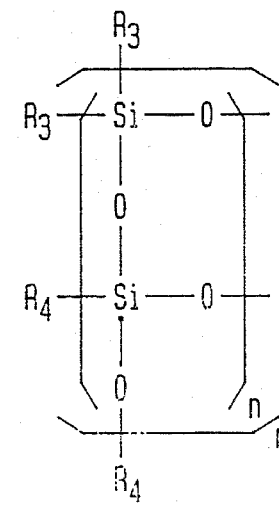

The polymer having a siloxane-bond (—Si—O—) structure present in the composition of the present invention is polymerized due to exposure with light or radiation. Examples of the polymer are as follows: a single-chain-form of polysiloxane as shown in FIG. 1(a), a ladder-form of polysiloxane as shown in FIG. 1(b), and a polymer having a three dimensional structure of polysiloxane as shown in FIG. 1(c). In FIG. 1, R1 and R2 which are an organic group (a side chain group, i.e., a group presented at side chain group), and R3 and R4 which are an end group present in a repeating unit, each of these groups can be a hydrogen atom, a hydroxyl group, a lower alkyl group having 1 to 5 carbon atoms, a lower alkoxyl group having 1 to 5 carbon atoms, a phenyl group, a benzyl group, a phenoxy group, a benzyloxy group, a trialkylsilyl group, etc.

As stated above, the condensation polymerization is caused by an anion or a cation produced from the sensitizing agent by exposure to light or radiation. The polymer having a siloxane-bond structure contains at least one side chain group or end group that is a functional group which causes this condensation polymerization. Examples of the functional group include a hydroxyl group, an alkoxyl group, or a phenoxy group. The polysilsesquioxane, which is a particularly preferable material for resist, contains a hydroxyl group and an alkoxyl group in a ratio of 1 to 1 as an end group, and an alkyl group or a phenyl group as a side chain group. When the composition of the present invention comprising a base polymer consisting essentially of a polymer having a siloxane-bond and a sensitizing agent is used for a resist material, this resist will have sufficient sensitivity to light and small absorbance to ultraviolet rays, and therefore it is suitable for a lithography utilizing light of short wavelength. The resolving power of the resist can also be maintained and prevented from decreasing due to the deviation of the depth of the focus of light for use in exposure, thereby forming a fine resist pattern even on a substrate with a large difference in level. The polymer having a siloxane-bond structure undergoes condensation polymerization when irradiated with light or radiation and becomes insoluble in a solvent. When the composition having sensitivity to light or radiation is used as a resist material by imparting polarity to the end group or the side chain group of the polymer having a siloxane-bond structure present in the composition, not only an organic solvent but also an alkali solution can be used as a developer, which leads to a low cost developer, the easy disposal and the safe handling thereof, and no pollution. The use of an alkali solution may also prevent a resist from swelling, thereby preventing the resolution of a resist pattern from decreasing.

When the composition of the present invention is used as a resist material, in order to raise the resistance to dry etching, the content of the polymer having a siloxane-bond structure of the composition is 10 percent by weight or more, and preferably 50 percent by weight or more. When the polymer content of the composition is less than 10 percent by weight, the resistance to dry etching of the composition decreases, thereby lowering the resolution of the transferred resist pattern. The above polymer having a siloxane-bond structure is used as a base polymer in the composition of the present invention, which may comprise an additional repeating unit such as styrene, α-methylstyrene, methylmethacrylate, methylacrylate, etc.

The process for preparing a polymer having a siloxane-bond structure will now be described in detail by reference to examples.

(1) A process for preparing ladder-form silicone (polyorganosilsesquioxane)

Hydrolysis of a trifunctional silicon compound provides ladder-form silicone as shown in FIG. 1(b). A case will now be described where methyltrichlorosilane is used as a trifunctional silicone compound. One mole of methyltrichlorosilane and two moles of distilled water are heated with reflux for 4 hours by the use of hydrochloric acid in a concentration of 2 ppm in a reactor with a reflux condenser, thus being hydrolyzed and condensed, thereby undergoing polymerization. Thereafter, the resulting solution is filtered, and the filtered substance is then dissolved in butanol to prepare a solution of polymethylsilsesquioxane. The solution thus prepared is a solution of polymethylsilsesquioxane having a hydroxyl group as an end group as shown in FIG. 1(b), wherein R1 and R2 are a methyl group, and R3 and R4 are a hydroxyl group.

The above reaction is represented by the formula as follows:

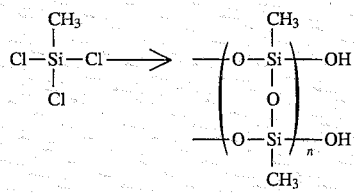

By the use of phenyltriethoxysilane as a starting material, the same reaction as described above is conducted to prepare polyphenylsilsesquioxane as shown in FIG. 1(b), wherein R1 and R2 are a phenyl group, and R3 and R4 are a hydroxyl group.

Further, by the use of methyltriethoxysilane as a starting material, the same reaction as described above is conducted to prepare polymethylsilsesquioxane which contains a hydroxyl group and an ethoxy group as an end group each in the same amount shown in FIG. 1(b), wherein R1 and R2 are a methyl group, and R3 and R4 are each independently a hydroxyl group or an ethoxy group.

The above reaction is represented by the formula as follows:

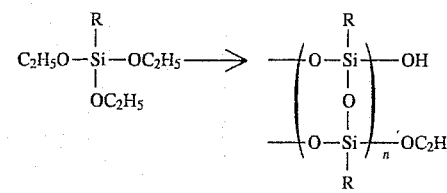

(2) The process for preparing a chain of silicone (polyorganosiloxane)

Hydrolysis of a bifunctional silicon compound provides a chain of silicone shown in FIG. 1(a). For example, hydrolysis and condensation of dimethyldichlorosilane provides polydimethylsiloxane which has a hydroxyl group as an end group as shown in FIG. 1(a), wherein R1 and R2 are a methyl group, and R3 is a hydroxyl group.

(3) The process for preparing a three dimensional silicone network.

Hydrolysis of a tetrafunctional silicon compound provides three dimensional silicone chain network as shown in FIG. 1(c). For example, hydrolysis and condensation of tetrachlorosilane provides polysiloxane which has a hydroxyl group as an end group as shown in FIG. 1(c), wherein R3, and R4 are a hydroxyl group.

When the functional group of a silicon compound as a starting material is chlorine, any type of polysiloxane obtained have hydroxyl groups as end groups as shown in FIG. 1, wherein R3 and R4 are a hydroxyl group. On the other hand, when the functional group is an alkoxy group (in the above formula, an ethoxy group), an hydroxyl group and an alkoxy group are present each in almost the same amount as an end group of the resulting polysiloxane.

As described above, a starting material may appropriately be selected to be polymerized so as to provide polysiloxane having the desired side chain groups, the desired end groups, and the desired frame-work of siloxane bonds according to objective thereof.

A polymer having a siloxane-bond structure may be selected from a chain form, ladder form, or three dimensional form of polymer network, wherein a side chain group is a group represented by R1 and R2 shown in FIG. 1, and an end group is a group represented by R3 and R4 shown in FIG. 1.

As a sensitizing agent present in the composition of the present invention, a substance which produces an acid or a substance which produces a radical when irradiated with light or radiation is used.

Examples of the sensitizing agent (an initiator or an acid producing agent) which produces an acid when irradiated with light or radiation include (1) to (3) described below. However, any compounds which produce acids when irradiated with light or radiation may be used. The compounds which produce acids by photolysis thereof described in U.S. Pat. No. 3,779,778 and Japanese Laid-Open Patent Publication No. 63-236028 may also be used in the composition of the present invention.

Onium salt

Onium salt produces a Brønsted acid when irradiated with light or radiation. Examples of the onium salt include diaryliodonium salt ($Ar_2I^+X^-$), triarylsulfonium salt ($Ar_3S^+X^-$), triarylselenium salt ($Ar_3Se^+X^-$), wherein aryl (Ar) is mono- to tri- substituted or non-substituted benzene having a methyl group, a methoxy group, a t-butyl group, a nitro group, chlorine, or a $CH_3CONH-$ group, etc., as a substituent group, and an anion $X^-$ is $PF_6^-$, $AsF_6^-$, $SbF_6^-$, $BF_4^-$, $ClO_4^-$, $CF_3SO_3^-$, $FSO_3^-$, $F_2PO_2^-$, etc.

(2) Diazonium salt

Aryldiazonium salt ($ArN_2^{+X^-}$) produces a Lewis acid when irradiated with light or radiation, wherein aryl (Ar) is mono- to tri- substituted or non-substituted benzene having a methyl group, a methoxy group, a morpholino group, a nitro group, chlorine, as a substituent group, and an anion $X^-$ is $PF_6^-$, $AsF_6^-$, $SbF_6^-$, $BF_4^-$, $FeCl_4^-$, $SbCl_6^-$, $SnCl_6^-$, etc.

(3) Sulfonate

Sulfonate produces a sulfonic acid when irradiated with light or radiation, such as α-hydroxymethylbenzoinsulfonate, N-hydroxyimidosulfonate, α-sulfonyloxyketone, β-sulfonyloxyketone, p-nitrobenzyldiethoxyanthracenesulfonate, o-nitrobenzyl tosylate, benzoin tosylate.

Examples of the sensitizing agent (the initiator) which produces a radical when irradiated with light or radiation present in the composition of the present invention include (1) to (3) described below. However, any compounds which produce radicals when irradiated with light or radiation may be used.

(1) Aromatic ketone

Aromatic ketone

Aromatic ketone such as benzophenone, thioxanthone, quinone, thioacridone, produces a radical when irradiated with light or radiation.

(2) Polyhalogenated hydrocarbon

Polyhalogenated hydrocarbon such as $CBr_4$, $CCl_4$, $RCCl_3$, $RCBr_3$, wherein R is a hydrogen atom, an alkyl group, an aryl group, or an aralkyl group, produces a radical when irradiated with light or radiation.

(3) A triazine compound

A triazine compound ($C_3H_3N_3$), the 1 to 3 atoms of hydrogen moiety of which is substituted with a trichloromethyl group ($CCl_3^-$) also produces a radical when irradiated with light or radiation. Examples of the compound include 2,4,6-Tris(trichloromethyl)-1,3,5-triazine, 2,4-Bis(trichloromethyl)-6-(p-methoxyphenyl)-1,3,5-triazine), etc.

When the composition of the present invention is used as a resist material by adding the above sensitizing agent that produces an acid or a radical when irradiated with light or radiation thereto, the resulting acid or the radical catalyzes the condensation polymerization of the above polymer having a siloxane-bond structure.

The content of the above sensitizing agent is preferably 40 percent by weight or less based on the weight of the base polymer. When the sensitizing agent content is 40 percent by weight or less based on the weight of the base polymer, the resistance to dry etching of the composition decreases, thereby degrading the resolution of the transferred resist pattern. The content of the above sensitizing agent differs depending on the kind of light or radiation for use in exposure, when irradiated with an electron beam, the sensitizing agent content is preferably 10 percent by weight or less based on the weight of the base polymer, and when irradiated with ultraviolet rays, the sensitizing agent content is preferably in the range of 0.2 to 10 percent by weight based on the weight of the base polymer.

The process for forming a resist pattern made of the composition having sensitivity to light or radiation of the present invention as a resist material will now be described. Conventional process for forming a resist pattern comprises a step of forming a smoothing layer, a step of forming a resist film, a step of exposure, and a step of development.

First, a smoothing layer is formed by a conventional method in order to level the uneven surface of a silicon substrate. The aforesaid composition having sensitivity to light or radiation is dissolved in an organic solvent to prepare a resist solution containing a solid in a concentration in the range of 5 to 50 percent by weight. The resist solution thus prepared is applied to the aforesaid leveled substrate by a spin coating process to form a film thereon. Then, the predetermined portions of the film are irradiated with light or radiation. The sensitizing agent in the irradiated portions produces an acid or a radical, which catalyzes a dehydration reaction or a de-alcoholization reaction of a polymer having a siloxane-bond structure as the other component of the resist film, thereby polymerizing the polymers. Then, a developer capable of dissolving the pre-polymerization polymer having a siloxane-bond structure is used, the polymerized portions is insoluble in the developer, thereby forming a negative type of a resist pattern. By the use of the resulting resist pattern as a mask, the substrate is etched with suitable etchant, plasma, etc., to form a fine pattern reflecting the resist pattern.

EXAMPLES

The present invention will now be explained in detail by reference to the following examples.

Example 1

FIG. 2 shows resist materials of Example 1.

Figure 2A:
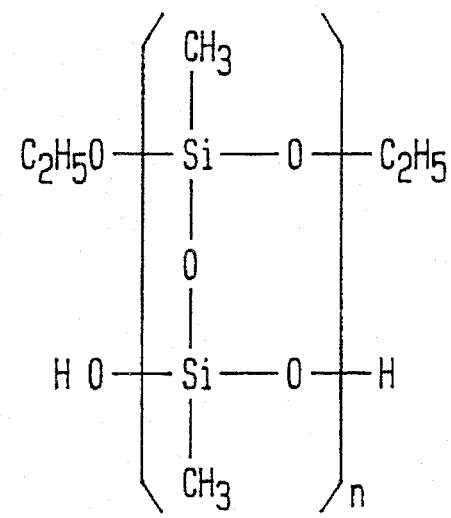
FIGS. 2(a) and 2(b) show diagrams representing the structure of the composition having sensitivity to light or radiation of Example 1 of the present invention.

FIG. 2(a) shows polymethylsilsesquioxane having a siloxane-bond structure having a methyl group as a side chain group, and a hydroxyl group and an ethoxy group as an end group. This compound is used as a base polymer, or solely serves as a resist material.

Figure 2B:
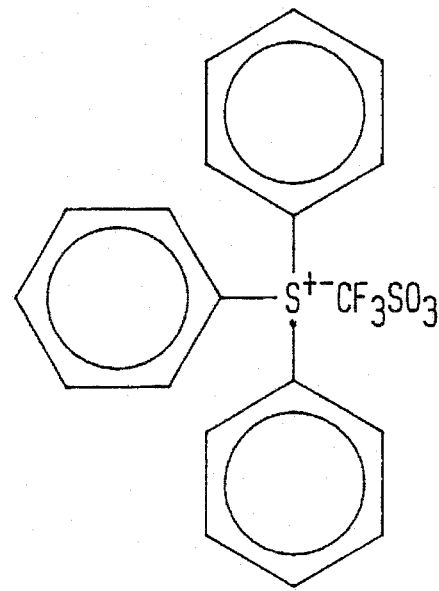

FIG. 2(b) shows triphenylsulfonium triflate which is comprised in a composition having sensitivity to light or radiation as a sensitizing agent (an initiator).

Hydrolysis and condensation of methyltriethoxysilane may provide polymethylsilsesquioxane as a base polymer. The number average molecular weight and the weight average molecular weight of the polymer are 1,310 and 3,320, respectively.

The polymer is dissolved in an ethylalcohol/butylalcohol solvent mixture (weight ratio of ethylalcohol to butylalcohol is 1:1) to prepare a solution of 10 percent by weight. Thereafter, 1 to 5 percent by weight of triphenylsulfonium triflate is added as a sensitizing agent to the resulting solution based on the weight of the polymer to prepare a resist solution.

Table 1 shows samples of the resist solution each having different concentration of a sensitizing agent therein.

TABLE 1

Sensitivity to an electron beam and ultraviolet rays of the resist material of the present invention

| Sample | Sensitizing agent concetration (wt %) | Sensitivity to an electron beam ($\mu C/cm^2$) | Sensitivity to ultraviolet rays ($mJ/cm^2$) |
|---|---|---|---|
| Sample 10 | 0 | 8.0 | >1000 |
| Sample 11 | 1 | 0.30 | 40 |
| Sample 12 | 2 | 0.25 | 35 |
| Sample 13 | 3 | 0.20 | 30 |
| Sample 15 | 5 | 0.18 | 27 |

These resist materials will now be each referred to as a sample 10, 11, 12, 13, or 15 according to the concentration of the sensitizing agent therein.

The resist solution is applied to a silicon substrate by a spin coating process at a rate of 2,000 spin/min so that the resulting film has a thickness of 0.5 μm. The resist film thus applied is dried by means of a hot plate at 75° C. for 2 minutes, after which the predetermined pattern is drawn by means of an electron beam with an acceralation voltage of 25 kV or far ultraviolet rays utilizing a Xe—Hg lamp as light source (exposure energy: 25 mW/cm$^2$). Then, by the use of a 5% aqueous solution of tetramethylammonium (TMAH) as a developer, dip development is conducted for 1 minute, which dissolved and removes the non-irradiated portions to form a resist pattern at the removed portions.

Table 1 shows the sensitivity to an electron beam and the sensitivity to far ultraviolet rays of each sample containing a sensitizing agent in different concentration.

Thus, Table 1 shows the measured values of the sensitivity to an electron beam and the sensitivety to far ultraviolet rays of the resist materials each containing a sensitizing agent in different concentration. The sensitivity to an electron beam and the sensitivity to far ultraviolet rays used herein are defined as exposure which may provide a film with a thickness of 50% of the initial film thickness.

Figure 3:
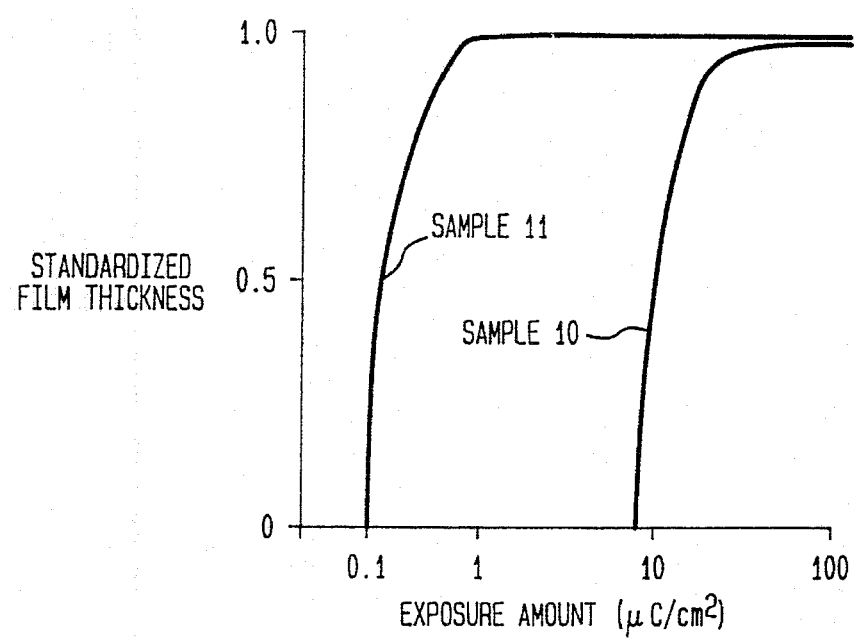
FIG. 3 shows a diagram representing the curves indicating the sensitivity to an electron beam of the resist from by the resist materials of Examples 1 of the present invention.

FIG. 3 shows curve indicating the sensitivity to an electron beam of the samples 10 and 11 each containing a sensitizing agent in concentrations of 0% and 1%, respectively.

As compared with the fact that SNR which is a conventional silicon-containing resist has a sensitivity to an electron beam in the range of 7 to 17 μC/cm$^2$, the resist formed in this example of the present invention is found to have much higher sensitivity. The same experiment indicates that all the resist formed from the resist material of the samples 11, 12, 13, and 15 can resolve a line and space pattern having a width of 0.5 μm with exposure amount in the range of 0.18 to 0.3 μC/cm$^2$. The resolution is not found to be lowered due to swelling as is often found in the case of a negative type of resist.

Even sample 10 that is a resist material containing no sensitizing agent may form a resist which has a sensitivity to an electron beam of 8 μC/cm$^2$, which is as high as that of conventional resists. This indicates that the resist which comprises only a base polymer without a sensitizing agent may independently serve as a resist material in the same manner as conventional resist materials. Sample 10 is a one-component resist material, has relatively high sensitivity to an electron beam and the high silicone content, and further can be developed by the use of an alkali developer, thereby serving as a resist material for an electron beam.

The weight average molecular weight of the polymer present in the sample 10 is 3,230, and a 5% solution of TMAH is used as a developer.

Figure 4:
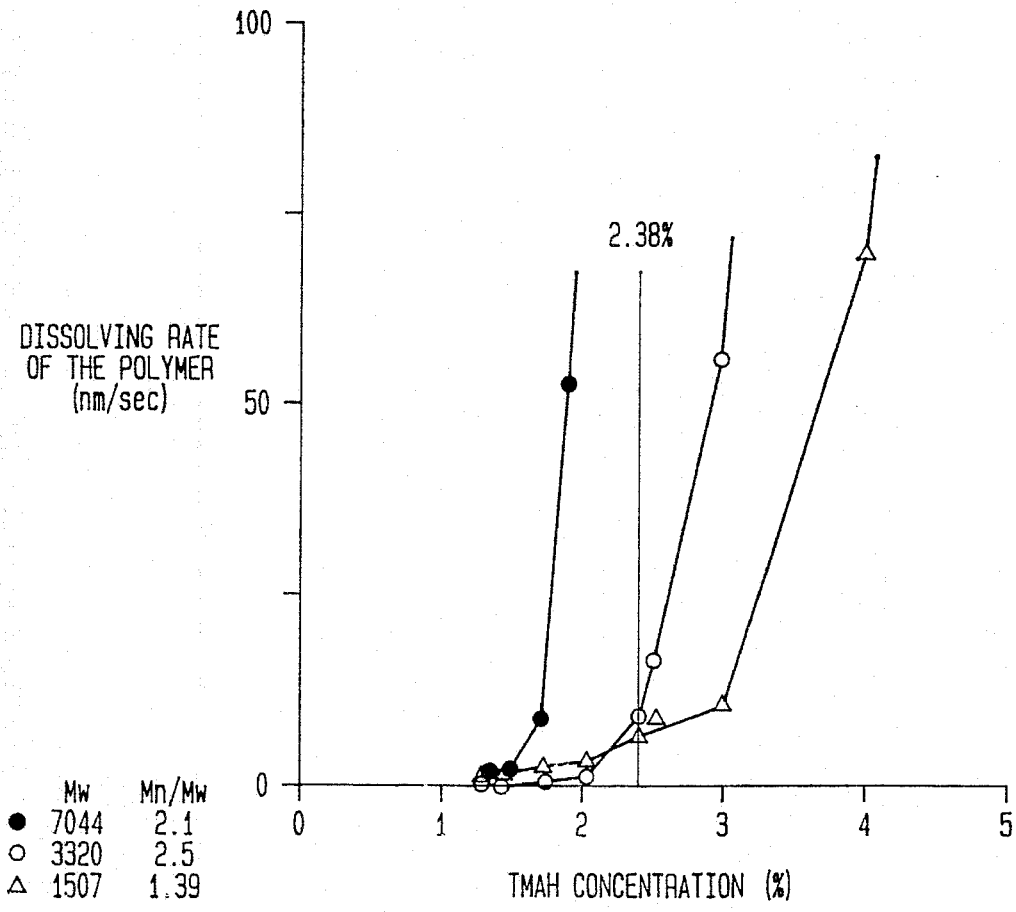
FIG. 4 is a graph representing the relationship between the molecular weight of the polymer having a siloxane-bond structure present in the composition of the present invention and the dissolving rate in a developer.

FIG. 4 shows the relationship between the concentration of a TMAH aqueous solution and the dissolving rate of a polymer having a siloxane-bond structure (see FIG. 2(a)) in the solution. In FIG. 4, the mark "●" denotes a sample of a polymer having a siloxane-bond structure having a molecular weight (Mw: weight average molecular weight) of 7,044, and a molecular weight distribution (Mn/Mw: the ratio of number average molecular weight to weight average molecular weight) of 2.1. The mark "o" denotes a sample of the polymer having a molecular weight of 3,320 and a molecular weight distribution of 2.5. The mark "Δ" denotes a sample of the polymer having a molecular weight of 1,507 and a molecular weight distribution of 1.39.

The data shown in FIG. 4 indicates that the dissolving rate of all the above polymers having a siloxane-bond structure having any molecular weight increases with an increase in the concentration of the TMAH solution. The straight line indicated as 2.38% represents the points where the concentration of the TMAH solution is 2.38%.

When the molecular weight of the polymer having a siloxane-bond structure decreases, the dissolving rate of the polymer can be raised only when the concentration of the TMAH solution is raised. Therefore, when the concentration of the TMAH solution is held constant, the dissolving rate of the polymer decreases with a decrease in the molecular weight of the polymer. This phenomenon is largely different from the dissolving property of conventional polymers as a resist.

Generally, as the molecular weight of a polymer decreases, the dissolving rate of the polymer increases. Therefore, with a positive type of resist made of conventional radiation degradable polymers such as PMMA, the molecular weight of the polymers at the irradiated portions decreases. On the other hand, with a negative type of resist made of radiation crosslinkable polymers such as SNR, the molecular weight of the polymers at the irradiated portions increases. When the above resists are developed, while the portions where the molecular weight of polymers is small dissolves, the portions where the molecular weight of polymers is large remains. Thus, development is conducted by taking advantage of the fact that while the portions where the molecular weight of polymers is large have a lower dissolving rate, the portions where the molecular weight of polymers is small has a high dissolving rate.

The dissolving property shown in FIG. 4 may be attributed to the chemical reaction between a TMAH solution and a polymer having a siloxane-bond structure. The polymer shown in FIG. 2(a) does not simply dissolve in the TMAH solution. The condensation reaction of the polymers is effected because of the presence of a hydroxyl group and an ethoxy group both as an end group thereof by catalysis of TMAH which is an alkali compound. That is, the polymers dissolve in the TMAH solution, while partially becoming insoluble.

When a polymer having a siloxane-bond structure which has low molecular weight and high content of end groups comes in contact with a TMAH solution, the condensation reaction of the polymers rapidly proceeds due to the change of dissolving property to insolubility. Therefore, at the portions where the molecular weight of polymers is 10,000 or less, a low molecular weight of polymer has a lower dissolving rate than a high molecular weight of polymer.

In a process for manufacturing a semiconductor device, a 2.38% solution of TMAH has been widely used as a developer for a photoresist. Therefore, a polymer which enables the development of the resist made of such polymer by the use of a 2.38% solution of TMAH may be used in the process without changing conventional equipments and conditions for manufacturing a semiconductor. The resist formed from a resist material containing the polymer having a siloxane bond structure of the present invention is a negative type of resist. Thus, if the dissolving rate of the polymer is 20 nm/sec or more, the resist may serve as a negative type of resist.

FIG. 4 indicates that in order to obtain a dissolving rate of the polymer of 20 nm/sec or more under a 2.38% solution of TMAH, the molecular weight of 3,320 of the polymer having a siloxane-bond structure is too small to develop a resist. When the weight average molecular weight of the polymer which serves as a base polymer is 7.044, the dissolving rate of the polymer in the 2.38% solution of TMAH can be sufficiently raised. Consequently, when the weight average molecular weight of a polymer made of the framework of siloxane bonds is 7.044, the resist made of the polymer may be developed to serve as a negative type of resist.

A resist comprising the polymer having a siloxane-bond structure having a weight average molecular weight of 7,044 as a base polymer may have the same relationship between the concentration of a sensitizing agent and the sensitivity of the resulting resist as that shown in Table 1.

Further, since a polymer having a siloxane-bond structure having a weight average molecular weight of 1,507 has a glass transition point lower than room temperature, when the resist material containing such polymer is applied to a substrate to form a resist film, the resulting resist film exhibits viscosity. Therefore, a polymer having a siloxane-bond structure having a weight average molecular weight of 1,507 is not suitable for use as a base polymer. Consequently, in order to use the polymer having a weight average molecular weight of 1,500 or less as a base polymer, the resulting resist film requires heat treatment at high temperature, etc., so as to facilitate the condensation reaction thereof, thereby eliminating the viscosity.

As apparent from the above discussion, when a resist material comprising the polymer having a siloxane-bond structure of the present invention is independently used as a resist for an electron beam, the weight average molecular weight of the polymer is preferably in the range of 2,000 to 100,000, and more preferably in the range of 3,000 to 50,000. When a solution of 5 percent by weight or less TMAH is used as a developer, the weight average molecular weight of the polymer of the present invention is preferably in the range of about 4,000 to about 20,000.

Table 1 indicates that the resist formed in this example of the present invention has very high sensitivity to far ultraviolet rays in the range of 20 to 40 mJ/cm$^2$.

By the use of this exposure apparatus, a line and space resist pattern with a width of 1 μm can be formed. This value indicates that a pattern with very high resolution is formed for contact exposure.

As stated above, the resist formed in this example of the present invention has high sensitivity to an electron beam and far ultraviolet rays and high resolution. However, the onium salt used as a sensitizing agent of this example of the present invention has an absorption peak at around 250 nm, and does not sensitize to light of a longer wavelength than 313 nm. Therefore, the resist has no sensitivity to a g-line (436 nm) and an i-line (365 nm) of a mercury lamp widely used at present in a process for manufacturing a semiconductor. The use of suitable organic dyes may impart the sensitivity of the resist to a g-line and an i-line. For preparing such a resist, to the resist material of a sample 11 comprising 1 percent by weight of onium salt as a sensitizing agent is added 3 percent by weight of phenothiazine ($C_{12}H_9SN$) as organic dyes to raise the sensitivity. This improves the sensitivity to a g-line to 80 mJ/cm$^2$, and the sensitivity to an i-line to 60 mJ/cm$^2$.

Phanothiazine is used as organic dyes for improving the sensitivity, because perylene as conventional organic dyes for improving the sensitivity is insoluble in a mixed solvent containing ethylalcohol and butylalcohol used as a solvent for the resist material, but phenothiazine has high solubility in such polar solvent.

The reaction mechanism of the composition having sensitivity to light or radiation will now be explained be reference to the resist formed from the resist material of the sample 11.

Figure 5A:
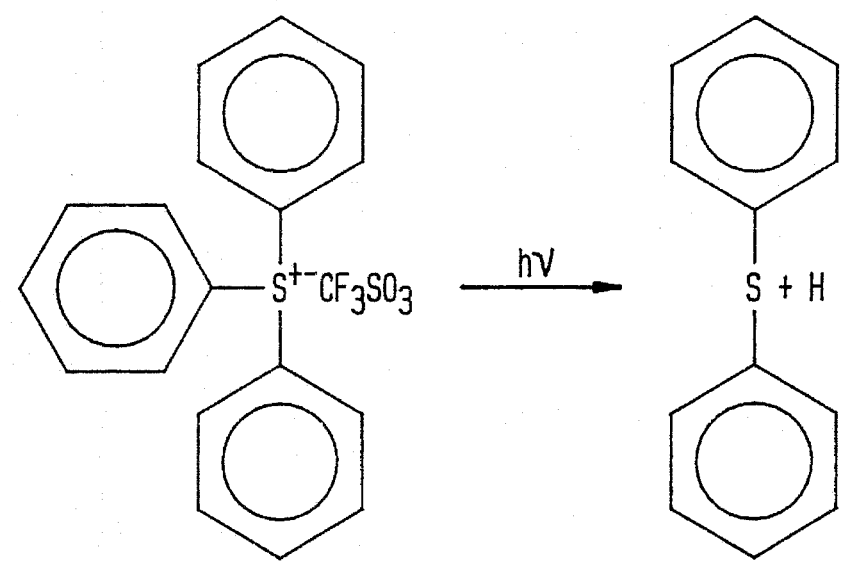
FIGS. 5(a) and 5(b) show diagrams representing the reaction mechanism of the composition having sensitivity to light or radiation of Example 1 of the present invention.
Figure 5B:
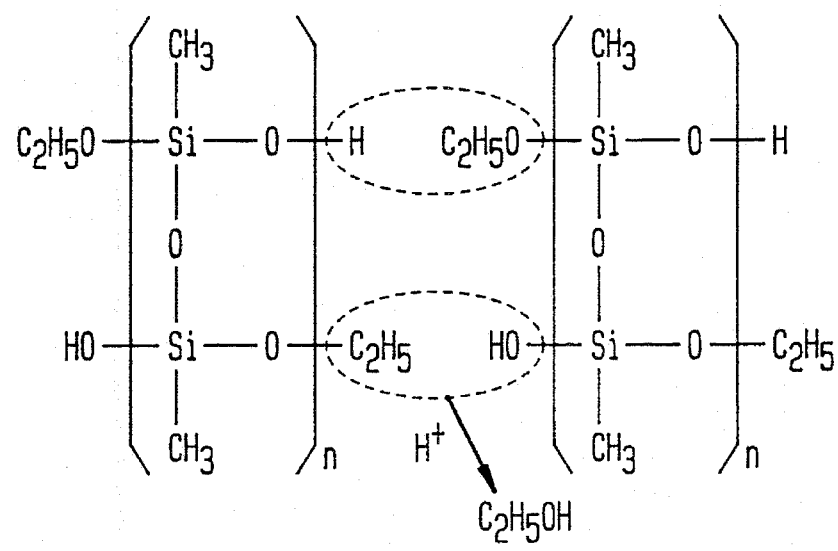

As shown in FIG. 5(a), when irradiated with light or radiation, the onium salt used as a sensitizing agent produces an acid. As shown in FIG. 5(b), the de-ethylalcoholization reaction of the hydroxyl group and the ethoxy group both as an end group of polymethylsilsesquioxane used as a base polymer is effected by catalysis of the resulting acid, thereby facilitating the polymerization of the polymer.

Generally, the solubility of a polymer decreases with an increase in the molecular weight of the polymer. Therefore, conventional polymerizable resists may serve as a negative type of resist by taking advantage of the property that some of the polymer constituting the resist becomes insoluble in a developer because of an increase in the molecular weight thereof when irradiated with light or radiation.

The solubility of the resist of the present invention in an alkali aqueous solution is mainly attributed to the presence of a hydroxyl group as an end group of polymethylsilsesquioxane. The irradiated portions of the resist rapidly becomes insoluble in a developer because of the progress of the reaction shown in FIG. 5(b). The irradiated portions of the resist of the present invention becomes insoluble because of an increase in the molecular weight, together with a change in the polarity of the polymers at the irradiated portion. This may markedly increase a difference in the dissolving rate between the irradiated portions and the non-irradiated portions. Consequently, the resist of the present invention has a characteristic of very high sensitivity and high contrast property.

The number average molecular weight and the weight average molecular weight of the base polymer herein used are 1,310 and 3,320, respectively. Not limited to the present example, the weight average molecular weight of the polymer may preferably be in the range of 2,000 to 500,000, and more preferably in the range of 3,000 to 100,000.

The molecular weight distribution, i.e., the value obtained by dividing the weight average molecular weight by the number average molecular weight, is 2.5 in this example. However, it is desirable that the molecular weight distribution be close to 1 as much as possible.

FIG. 6 shows the resist materials of Example 2.

Figure 6A:
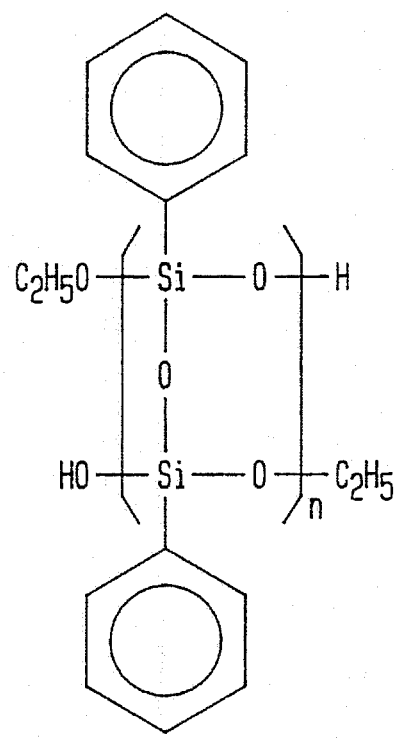
FIGS. 6(a) to 6(c) show diagrams representing the structure of the composition having sensitivity to light or radiation of Example 2 of the present invention.
Figure 6B:
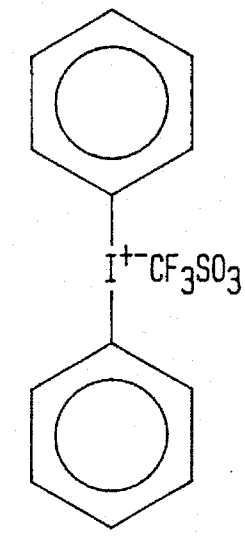
Figure 6C:
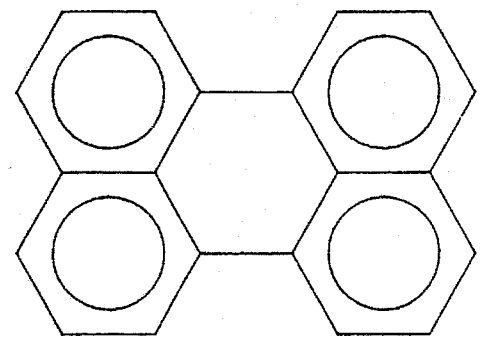

In these resist materials, polydiphenylsilsesquioxane having a siloxane-bond structure shown in FIG. 6(a) comprising a phenyl group as a side chain group and a hydroxyl group and an ethoxy group as an end group is a base polymer. Diphenyliodonium fluoroantimonate shown in FIG. 6(b) is a sensitizing agent (an initiator), perylene ($C_{28}H_{18}$) shown in FIG. 6(c) is used as a sensitizer. A composition having sensitivity to light or radiation, which contains these materials, will now be explained.

A resist material containing no sensitizing agent will be referred to as a sample 20, and a resist material containing a sensitizing agent and a sensitizer each in an amount of 1 percent by weight will be referred to as a sample 21 hereinafter.

Hydrolysis and condensation of phenyltriethoxysilane provides polydiphenylsilsesquioxane as a base polymer. The number average molecular weight and the weight average molecular weight of the polymer are 1,900 and 3,420, respectively.

The above polymer is dissolved in butyl acetate to prepare a 10 wt. % solution. Then, to the resulting solution is added 1 percent by weight of diphenyliodonium triflate as a sensitizing agent and 1 percent by weight of perylene based on the weight of the polymer to prepare a resist solution.

The resist solution is applied to a silicon substrate by a spin coating process at a rate of 2,200 spin/min so that the resulting resist film has a thickness of 0.5 μm. The resist film thus applied is dried by means of a hot plate at 75° C. for 2 minutes, after which by the use of a stepper utilizing a g-line as light source (exposure wavelength: 436 nm, the numerical aperture of a lens: 0.45) or a stepper utilizing an i-line as light source (exposure wavelength: 365 nm, the numerical aperture of a lens: 0.40), the resist film is exposed to ultraviolet rays through a photomask having a predetermined light non-transmissive pattern. In both the above cases, radiation energy during exposure to ultraviolet rays is 250 mW/cm$^2$. By the use of a methylethylketone/isopropylalcohol mixed solvent in a volume ratio of methylethylketone to isopropylalcohol of 1:1 as a developer, dip development is conducted for 1 minute.

Sample 21 has a sensitivity to a g-line of 12 mJ/cm$^2$ and a sensitivity to an i-line of 45 mJ/cm$^2$. The resist made of the resist material of the present invention may also have very high sensitivity to ultraviolet rays (g-line, i-line) owing to the use of a sensitizer. Both exposures above can provide a line and space resist pattern with a width of 0.8 μm.

In this case, development is conducted by the use of an organic solvent, but may also be conducted by the use of a TMAH aqueous solution.

EXAMPLE 3

FIG. 7 shows resist materials of Example 3.

Figure 7A:
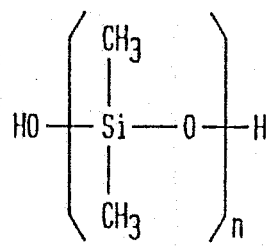
FIGS. 7(a) and 7(b) show diagrams representing the structure of the composition having sensitivity to light or radiation of Example 3 of the present invention.
Figure 7B:
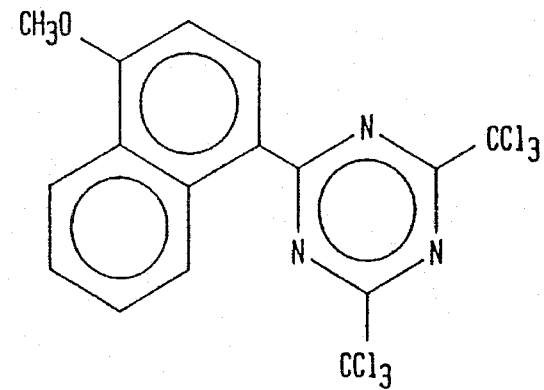

In these resist materials, polydimethylsiloxane having a siloxane-bond structure comprising a methyl group as a side chain group and a hydroxyl group as an end shown in FIG. 7(a) group is used as a base polymer. 2-(4'-methoxy-1'-naphthyl)-4, 6-bis(trichloromethyl)-1,3,5-triazine shown in FIG. 7(b) is a sensitizing agent (an initiator). A composition having sensitivity to light or radiation which comprises these materials will now be explained.

Hydrolysis and condensation of dimethyldichlorosilane provides polydimethylsiloxane as a base polymer. The number average molecular weight and the weight average molecular weight of the polymer are 1,960 and 3,640, respectively.

The above polymer is dissolved in butylalcohol/ethylalcohol mixed solvent (weight ratio of butylalcohol to ethylalcohol is 1:1) to prepare a 10 wt. % solution. Then, to the resulting solution is added 1 percent by weight based on the weight of the polymer of the above triazine compound as a sensitizing agent to prepare a resist solution. The resist solution is applied to a silicon substrate by a spin coating process at a rate of 1,700 spin/min so that the resulting resist film has a thickness of 0.5 μm. The resist film is dried by means of a hot plate at 75° C. for 2 minutes, after which by the use of a stepper utilizing an i-line as light source (exposure wavelength: 365 nm, the numerical aperture of a lens: 0.40), the resist film is exposed to ultraviolet rays through a photomask with a predetermined pattern. The radiation energy during exposure to ultraviolet rays is 250 mW/cm$^2$. By the use of a 2.38% solution of TMAH as a developer, dip development is conducted for 1 minute. The sensitivity to an i-line of this resist is 33 mJ/cm$^2$. The above exposure may also provide a line and space resist pattern with a width of 1 μm.

EXAMPLE 4

FIG. 8 shows resist materials of Example 4.

Figure 8A:
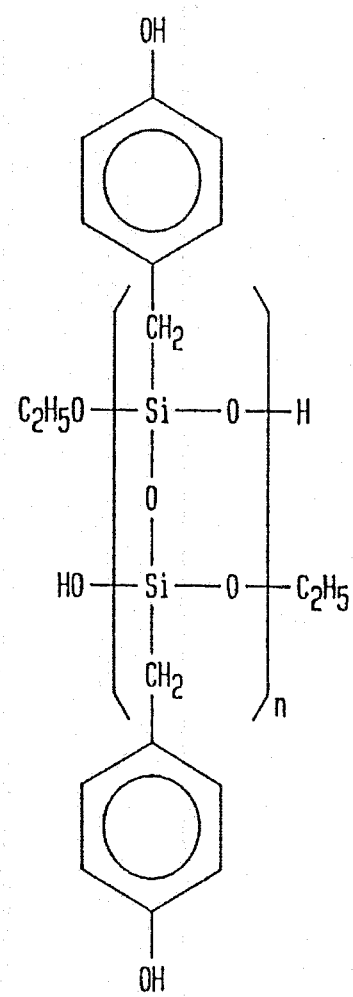
FIGS. 8(a) and 8(b) show diagrams representing the structure of the composition having sensitivity to light or radiation of Example 4 of the present invention.
Figure 8B:
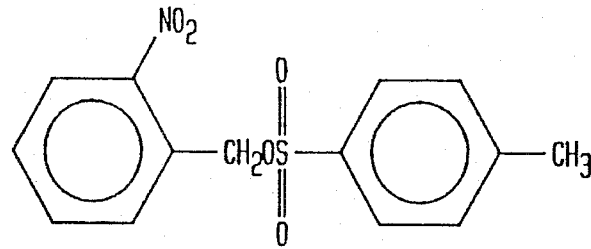

In these resist materials, polyhydroxybenzylsilsesquioxane having a siloxane-bond structure comprising a hydroxylbenzyl group as a side chain group and a hydroxyl group and an ethoxy group as an end group as shown in FIG. 8(a) is used as a base polymer, and O-nitrobenzyl tosylate shown in FIG. 8(b) is a sensitizing agent (an initiator). A composition having sensitivity to light or radiation which contains these materials will now be explained.

The above polymer is dissolved in butylalcohol/ethylalcohol mixed solvent (weight ratio of butylalcohol to ethylalcohol is 1:1) to prepare a 10 wt. % solution. Then, to the resulting solution is added 1 percent by weight based on the weight of the polymer of the above o-nitrobenzyl tosylate as a sensitizing agent to prepare a resist solution.

The resist solution is applied to a silicon substrate by a spin coating process at a rate of 2,100 spin/min so that the resulting resist film has a thickness of 0.5 μm. The resist film is dried by means of a hot plate at 75° C. for 2 minutes, after which by the use of an aligner utilizing a Xe-Hg lamp as light source, the resist film is exposed to ultraviolet rays through a photomask with a predetermined pattern. The radiation energy during exposure to ultraviolet rays is 250 mW/cm$^2$. by the use of a 2.38% solution of TMAH, dip development is conducted for 1 minute. The sensitivity to an i-line of this resist is 60 mJ/cm$^2$. The above exposure provides a line and space resist pattern with a width of 1 μm.

In the above example, the base polymer having a weight average molecular weight of about 3,000 is described. The weight average molecular weight is not limited to this Example, it is preferably in the range of 500 to 500,000, and more preferably in the range of 1,000 to 100,000. However, when development is conducted by the use of an alkali aqueous solution, the weight average molecular weight needs to be restricted up to about 10,000. The molecular weight distribution, i.e., the value obtained by dividing the weight average molecular weight by the number average molecular weight is desirably close to 1 as much as possible.

Figure 9:
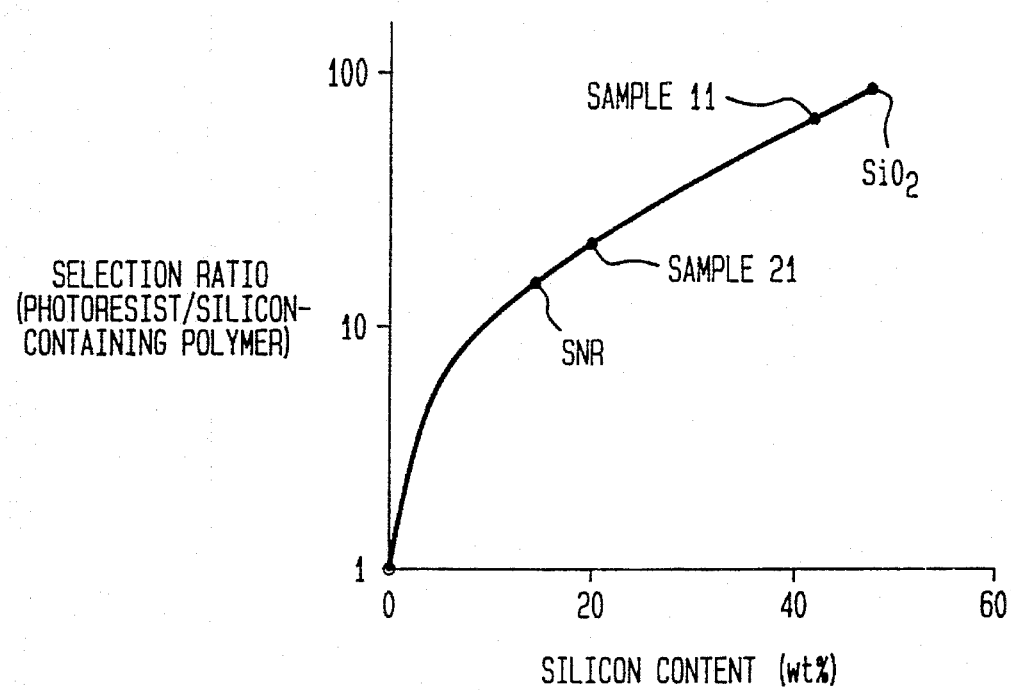
FIG. 9 is a graph showing the relationship between the silicon content and the resistance to dry etching of the polymer of the present invention.

In all of the Examples mentioned above, a sensitizing agent is contained in a concentration range of 0 to 5 percent by weight based on the weight of the base polymer. The concentration of sensitizing agent may practically be in the range of 0 to 40 percent by weight. When the concentration of sensitizing agent is high, the silicon content of the resist film decreases, which entails a problem in that the resistance to plasma etching is decreased as shown in FIG. 9. Since the polymer having a siloxane-bond structure has excellent property as described below, it is desirable that the concentration of the sensitizing agent may be lowered as much as possible in order to raise the polymer content of the resist film.

As described above, the polymer may have sufficient sensitivity to an electron beam even with no sensitizing agent contained, thereby being able to be used independently as a resist. However, a problem arises in that the sensitivity to ultraviolet rays or far ultraviolet rays markedly decreases when the concentration of the sensitizing agent content is 0.2% by weight or less based on the weight of a base polymer. Therefore, it is necessary to vary the concentration of the sensitizing agent according to the end use thereof. As described above, when the polymer is independently used as a resist, the property of the resist is decided upon the balance between the sensitivity to light or radiation and the silicon content of the resist. When used as a resist for an electron beam, the concentration of sensitizing agent in the range of 0 to 10 percent by weight based on the weight of a base polymer is very effective as a resist, while when used as a resist for ultraviolet rays, the range of 0.2 to 10 percent by weight based on the weight of a base polymer is very effective as a resist.

Even the composition having no sensitizing agent has sufficient sensitivity for use as a resist for an electron beam. Therefore, unless very high sensitivity is required, it is effective to use a base polymer containing no sensitizing agent as a one-component resist so that the excellent property of the polymer may be fully utilized.

The characteristics of the composition having sensitivity to light or radiation will now be described. First, the resist material of the present invention has the high silicon content as shown in FIG. 9. In particular, the resist material (sample 11) shown in FIG. 2 has the silicone content close to that of a silicon dioxide film (SiO$_2$), thereby providing high resistance to plasma. This may improve the selection ratio during a process of etching, and therefore a resist pattern may be transferred with high resolution.

Figure 10:
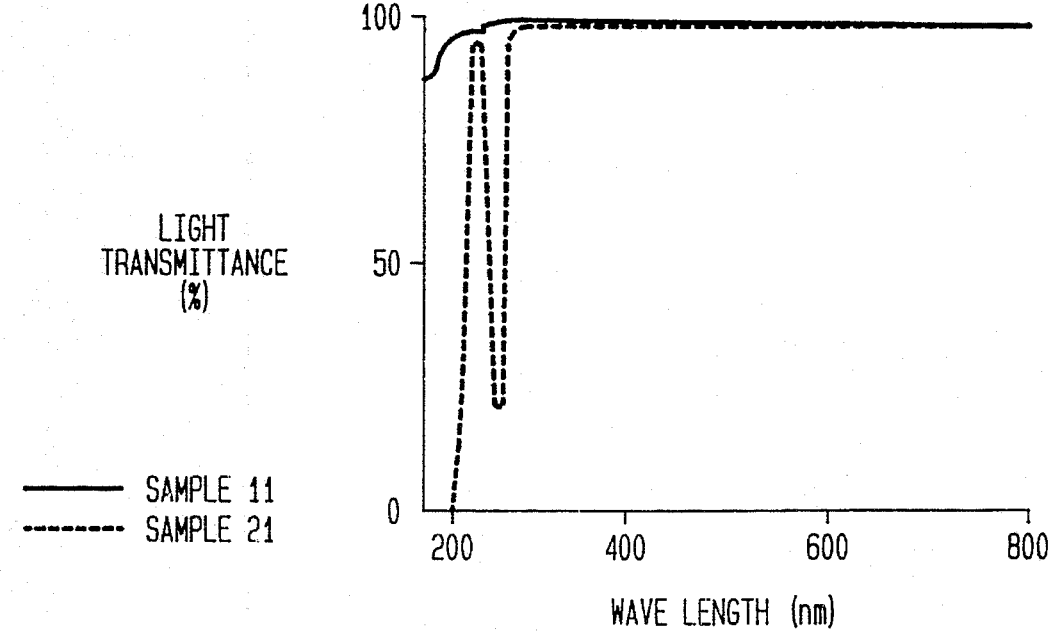
FIG. 10 is a graph showing the light transmittance of a resist formed from the composition of the present invention.

FIG. 10 shows the light transmittance of the resist material of the present invention, wherein the full line represents the light transmittance of a sample 11 with a film thickness of 1 μm, and the broken line denotes the light transmittance of a sample 21 with a film thickness of 1 μm.

Sample 21 has high light transmittance in a wide range from visible light to medium ultraviolet rays while absorbing light of a wavelength of 300 nm or less according to a phenyl group thereof. On the other hand, sample 11 has high light transmittance of all the range from visible light to far ultraviolet rays. Thus, the resist material of the present invention has high light transmittance. This is attributed to the fact that the base polymer made of a framework of the siloxane bonds has high light transmittance to ultraviolet rays and that the concentration of sensitizing agent can be restricted to a lower concentration degree because the resist material utilizes the chemically sensitizable reaction.

Figure 11:
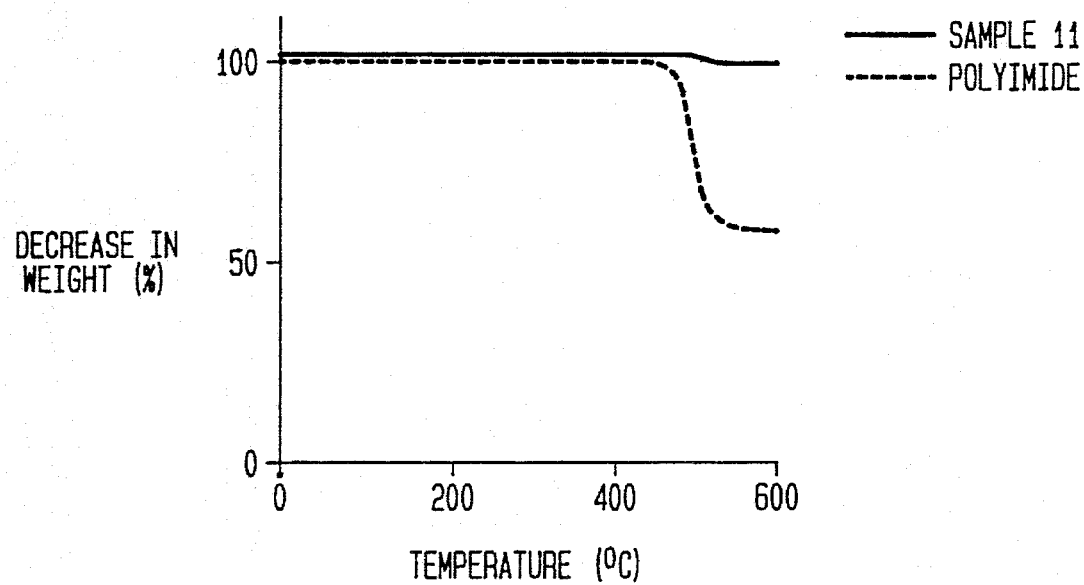
FIG. 11 is a graph showing the thermal resistance of the resist formed from the composition of the present invention.

FIG. 11 shows the results of thermogravimetric analysis, wherein the full line represents the value of sample 11 with a film thickness of 1 μm, and the broken line denotes the value of polyimide with a film thickness of 1 μm.

These samples are hardened at 200° C. for 30 minutes, after which how the weight of the samples decreases during the heat treatment is shown.

The weight of sample 11 scarcely decreases at temperatures up to 500° C., and slightly decreases even at 500° C. or more. This decrease in weight of the sample occurs because the methyl groups at the side chains groups are dissociated from the polymer of the sample. Polyimide has been widely used as conventional heat-resistant polymer material. FIG. 11 clearly shows that the resist of the present invention has higher heat resistance compared with polyimide. Sample 11 is used to prepare a resist pattern by exposure and development. The resulting resist pattern is heated, after which the thermal deformation of the resist pattern is observed. However, at temperatures up to 300° C., no thermal deformation of the resist pattern can be observed. On the other hand, the resist pattern of a conventional photoresist begins to deform at about 120° C. Consequently, the resist pattern of the present invention is found to possess remarkedly high thermal resistance.

As compared with other organic film, since the resist of the present invention is mainly composed of polysiloxane, it has high electrical insulating property, high hardness, excellent water resisting property, low hygroscopic property, high adhesion to a metal substrate or a silicon substrate, and further high capability of leveling the uneven surface of a substrate.

As described above, the composition having sensitivity to light or radiation of the present invention has sensitivity to light, together with high plasma resistance, high light transmittance, high thermal resistance, high electrical insulating property, high hardness, high water resisting property, low hygroscopic property, high adhesion, and high smoothing capability. Therefore, the resist has not only a use for a resist material for preparing fine elements but also various other uses.

The method for manufacturing a semiconductor device will now be described wherein the composition having sensitivity to light or radiation of the present invention is used as a resist material.

First, the case will be described in detail by reference to FIG. 12, where the composition having sensitivity to light or radiation of the present invention is used as an upper resist in a two-layer resist method for an electron beam lithography.

To a semiconductor substrate having uneven surface 1 is applied to polyimide with a thickness of 2 μm. Thereafter, the polyimide film is heat treated at 200° C. to form a smoothing layer 2, to which is applied the resist material of the present invention with a thickness of 0.25 μm (FIG. 12(*a*)).

In this case, the resist material shown in FIG. 2 is used wherein polymethylsilsesquioxane having a siloxane-bond structure which contains a methyl group as a side chain group and a hydroxyl group and an ethoxy group as an end group is a base polymer, and triphenylsulfonium triflate is a sensitizing agent. The number average molecular weight and the weight average molecular weight of polymethylsilsesquioxane are 3,273 and 7,044, respectively, and the concentration of sensitizing agent content is 2 percent by weight.

Figure 12A:
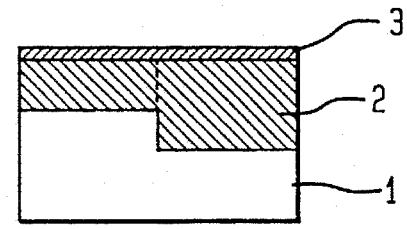
FIGS. 12(a) to 12(c) show diagrams illustrating a process for forming a resist by a two-layer resist method of the present invention.
Figure 12B:
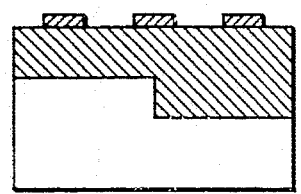
Figure 12C:
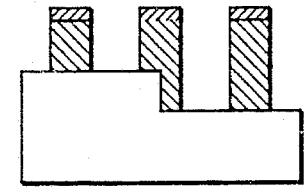

Next, the predetermined portions of the resist film are exposed to an electron beam at an exposure amount of 0.3 μC/cm$^2$, after which the resist is developed in a 2.38% solution of TMAH (FIG. 12(*b*)).

Further, the smoothing layer 2 is etched by means of dry etching by the use of oxygen. In this process, an upper layer with a resist pattern is used as a mask for dry etching, and the pattern at the predetermined portions exposed to an electron beam is transferred to the lower smoothing layer 2 (FIG. 12(*c*)). This method may provide a pattern with a width of 0.3 μm on a semiconductor substrate having a difference in level of 1 μm by a low exposure amount rate of 0.3 μC/cm$^2$.

Secondly, the method for preparing a phase shifting mask will be described in detail by reference to FIGS. 13 and 14, wherein the composition having sensitivity to light or radiation of the present invention is used as a resist material.

The phase shifting mask is obtained by improving a photomask for use in exposure by means of a conventional projection and exposure apparatus in order to form a fine pattern. Thus, a method is for forming a finer resist pattern by imparting a phase difference to light from an optimal system which is used in exposure. Examples of the method utilizing such a photomask (hereinafter, referred to as a phase shifting mask) are described in Japanese Laid-Open Patent Publication No. 62-50811, Japanese Laid-Open Patent Publication No. 62-59296, etc.

According to the method herein proposed, the original picture of a pattern to be transferred to a photomask substrate is made of a light non-transmissive film. A phase shifter having a pattern on a transparent film is provided on either of transparent portions having a pattern. These transparent portions hold the light non-transmissive film between them or are formed at both sides of the light non-transmissive film. The phase shifter changes the phase of light to be exposured.

However, the above phase shifter for use in a conventional photomask needs to be transparent with respect to light having wavelength up to that of ultraviolet rays. On handling the photomask, it is desirable that the phase shifter has high hardness, and high resistance to shock, and furthermore, has excellent thermal resistance and chemical resistance for washing thereof when dust, etc., deposit thereover. Moreover, the phase shifter is required to have high water resisting property, low hygroscopic property, and high adhesion to a substrate, concerning washing.

The process for forming a phase shifter will now be described, wherein the composition having sensitivity to light or radiation of the present invention is used as a resist material.

Figure 13A:
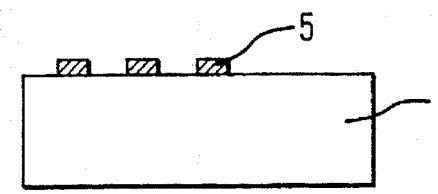
FIGS. 13(a) to 13(c) show diagrams illustrating a process for preparing a phase shifting mask of the present invention.
Figure 13B:
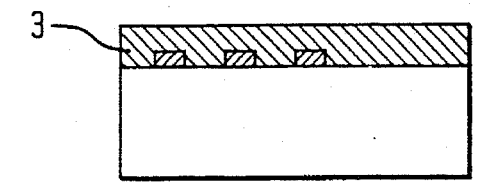
Figure 13C:
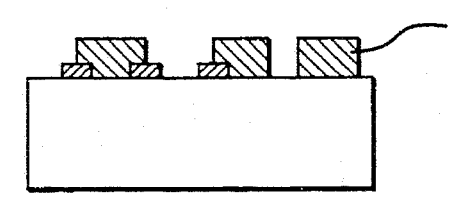

FIG. 13(*a*) shows a photomark comprising a chrome film with a pattern 5 on a quartz substrate 4.

To the above mask is applied the composition having sensitivity to light or radiation of the present invention as a resist material with a thickness of 0.53 μm (FIG. 13(*b*)).

In this case, polymethylsilsesquioxane having a siloxane-bond structure which contains a methyl group as a side chain group and a hydroxyl group and an ethoxy group as an end group is used as a resist material. The weight average molecular weight of this resist material is 7,044. The resist material containing no sensitizing agent is used so as to avoid the adsorption of ultraviolet rays by the sensitizing agent.

This resist film is heat treated at 70° C., after which the treated film is exposed to an electron beam at a rate of 25 μC/cm$^2$, and then developed by the use of a 2.38% solution of TMAH to form a resist pattern (FIG. 13(*c*)).

When the resist of the present invention is exposed to an electron beam, a lamination of the chrome film with a pattern and a resist pattern are exposed based on detection of the positioning mark on the chrome film.

Moreover, the heat-treatment of this mask substrate at 200° C. completes the reaction of the end group of the pre-polymerization polymer (—OH, —C$_2$H$_5$OH), thereby stabilizing the resist.

The resist thus prepared is used as a phase shifter 6. As described before, this resist is transparent to light having wavelength up to that of ultraviolet rays, and has high thermal resistance and chemical resistance, and concerning washing has further properties of high water resisting property, low hygroscopic property, and high adhesion to a substrate.

As described above, the phase shifting mask may be prepared in a easy process as shown in FIG. 13.

FIG. 14 shows the construction of another phase shifting mask by the use of the resist of the present invention as a phase shifter.

Figure 14A:
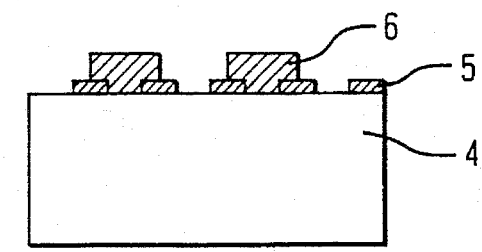
FIGS. 14(a) to 14(c) show the other diagrams illustrating phase shifting masks prepared according to the process of the present invention.

FIG. 14(a) shows a Levenson type phase shifting mask comprising the phase shifter 6 arrayed at every other groove of the chrome film with a pattern 5.

Figure 14B:
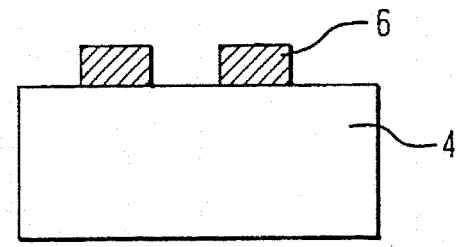

FIG. 14(b) shows a transparent type phase shifting mask comprising only a phase shifter 6 which has a pattern formed by said phase shifter.

Figure 14C:
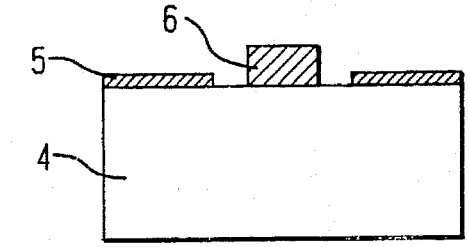

FIG. 14(c) shows an emphasized-edge type phase shifting mask comprising the phase shifter 6 arrayed at a predetermined distance from the groove of the chrome film with a pattern 5.

Hitherto, a silicon dioxide film ($SiO_2$) or a coated oxide film (SOG) has been used as the phase shifter of a phase shifting mask. According to the method by the use of this conventional phase shifter, a resist pattern is formed on a silicon dioxide film or a SOG film, and by the use of the resulting resist pattern as a mask, a phase shifting pattern is formed by dry etching. This conventional method involves a complicated manufacturing process, accompanied with increased defective density.

According to the aforesaid method wherein the resist of the present invention is used for a phase shifting mask, the pattern of the phase shifter 6 can be directly drawn by means of an electron beam, thereby largely simplifying the process for preparing a phase shifting mask.

The case where the composition having sensitivity to light or radiation of the present invention is used as a chip covering material of a semiconductor device will now be described in detail by reference to FIG. 15.

Figure 15A:
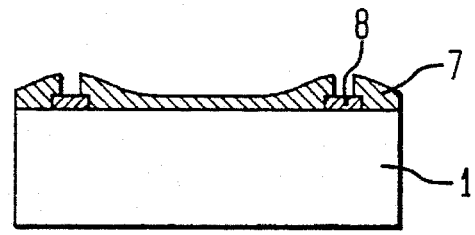
FIGS. 15(a) to 15(d) show a diagram illustrating a process for manufacturing a semiconductor device of the present invention.
Figure 15B:
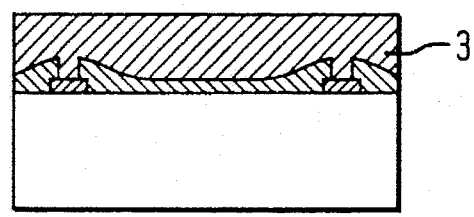

As shown in FIG. 15(a), semiconductor elements are provided on the silicon substrate 1. All the surface of a silicon substrate 1 except the portions where bonding pads 8 made of an aluminum film is formed, is covered by a silicon nitride film used as a protective coat 7, thereby opening windows of the protective coat at the bonding pad portions.

The resist material of the present invention is applied to this coated substrate 1 with a thickness of 3.5 μm, after which the resulting film is heat treated at 70° C. (FIG. 15(b).

In this case, a composition is used as a resist material, wherein polyphenylsilsesquioxane having a siloxane-bond structure which contains a phenyl group as a side chain group and a hydroxyl group and an ethoxy group as an end group is a base polymer, diphenyliodonium triflate is a sensitizing agent, and perylene is a sensitizer.

Figure 15C:
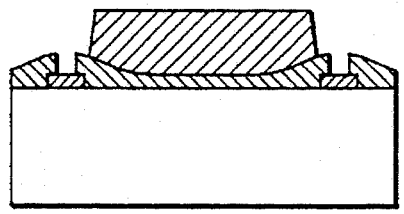
Figure 15D:
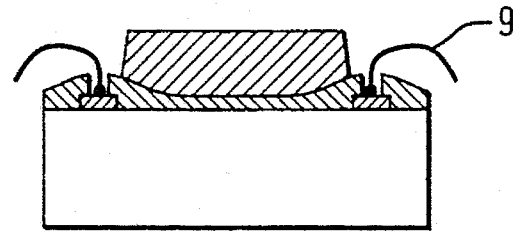

The resist film is exposed to light by means of a stepper utilizing a g-line at a exposure amount of 60 mJ/cm², after which the irradiated film is developed by the use of a 5% TMAH solution to leave the resist film on the circuit portions on the semiconductor substrate 1 (FIG. 15(c)).

Further, an open window at the bonding pads 8 on the substrate 1 is connected to gold wires 9 by wire-bonding, thereby completing a semiconductor device.

As stated above, since this resist material has high thermal resistance as well as high chemical resistance, it may be directly used as a chip covering material.

Polyimide has been used as a conventional chip covering material. In order to open a window on a polyimide film for bonding pads, a resist pattern should be formed on the polyimide film, and then the polyimide film should be etched by means of wet etching through the resist pattern as a mask.

While the above conventional method involves a complicated manufacturing process, the use of the resist material of the present invention has a chip covering material enables a window to be opened by exposure to ultraviolet rays, thereby largely simplifying the process.

Since this resist has high transparency to light including ultraviolet rays as stated above, it is particularly effective as a window material for EPROM (erasable programmable read-only memory) wherein data is erased by irradiation with ultraviolet rays.

As stated above, the composition having sensitivity to light or radiation of the present invention may be applied for various materials besides a resist material for use in an upper resist film of a two-layer resist, a chip covering material on a protective coat of a semiconductor device, a material for constituting a phase shifting film for a phase shifting mask.

For example, the composition of the present invention may be used as a material of a micro lens for use in converging light from CCD, a material for constituting an α-rays cutoff film of a semiconductor element, a protective coat material of a semiconductor device, a layer insulation film material for multilayer inter-connection, a smoothing layer material for multilayer inter-connection of a semiconductor device, a smoothing material of a bubble memory device, an insulating layer material of a thin film magnetic head, etc.

When the composition of the present invention is used for the above materials, a pattern may be directly formed by exposure as mentioned in Examples, and it is necessary to denote that the resulting pattern has high resistance to plasma, high transparency, high thermal resistance, high electric insulating property, high hardness, high water resisting property, low hygroscopic property, high adhesion to substrate, high smoothing capability, etc.

The Examples mentioned above, illustrate the exposure of predetermined pattern to ultraviolet rays or an electron beam. The light source is not limited to those used in the Examples, the use of an ion beam or an X-ray may be possible.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A process for forming a pattern, comprising the steps of:

forming a smoothing layer on a substrate;

applying a composition having sensitivity to light or radiation to said smoothing layer to form a resist film, wherein said composition consists essentially of a polymer having a siloxane-bond structure and having at least one end group or a side chain group, and a sensitizing agent, each of said end group and said side chain group is a functional group which causes condensation polymerization upon exposure to acid; and exposing a portion of said resist film to light or radiation, thereby causing said sensitizing agent to provide an acid which causes condensation polymerization at said end group or said side chain group of said polymer; and developing said resist film by the use of an alkali developer.

2. A process for forming a pattern, comprising the steps of:

forming a smoothing layer on a substrate;

applying a composition having sensitivity to light or radiation to said smoothing layer to form a resist film, wherein said composition consists essentially of a polymer having a siloxane-bond structure and having at least one end group or a side chain group, a sensitizing agent, and a dye having high solubility in a polar solvent, each of said end group and said side chain group is a functional group which causes condensation polymerization upon exposure to acid;

exposing a portion of said resist film to light or radiation, thereby causing said sensitizing agent to produce an acid which causes condensation polymerization at said end group or said side chain group of said polymer; and developing said resist film by the use of an alkali developer.

3. A process for forming a pattern, comprising the steps of:

forming a smoothing layer on a substrate;

applying a composition having sensitivity to light or radiation to said smoothing layer to form a resist film, wherein said composition consists essentially of a polymer having a siloxane-bond structure and a sensitizing agent, said polymer having a structure selected from the group of structures represented by the following general formula:

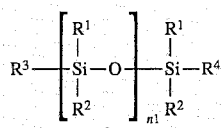

wherein $R^1$, $R^2$, $R^3$, and $R^4$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^3$ and $R^4$ is a lower alkoxyl group having 1 to 5 carbon atoms; and n1 is an integer of 1 or more;

exposing a portion of said resist film to light or radiation, thereby causing said polymer to undergo a polymerization reaction; and developing said resist film by the use of an alkali developer.

4. A process for forming a pattern, comprising the steps of:

forming a smoothing layer on a substrate;

applying a composition having sensitivity to light or radiation to said smoothing layer to form a resist film, wherein said composition consists essentially of a polymer having a siloxane-bond structure and a sensitizing agent, said polymer having a structure selected from the group of structures represented by the following general formula:

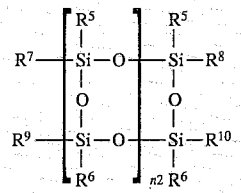

wherein $R^5$, $R^6$, $R^7$, $R^8$, $R^9$, and $R^{10}$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^7$, $R^8$, $R^9$, and $R^{10}$ is a lower alkoxyl group having 1 to 5 carbon atoms; and n2 is an integer of 1 or more;

exposing a portion of said resist film to light or radiation, thereby causing said polymer to undergo a polymerization reaction; and developing said resist film by the use of an alkali developer.

5. A process for forming a pattern, comprising the steps of:

forming a smoothing layer on a substrate;

applying a composition having sensitivity to light or radiation to said smoothing layer to form a resist film, wherein said composition consists essentially of a polymer having a siloxane-bond structure and a sensitizing agent, said polymer having a structure selected from the group of structures represented by the following general formula:

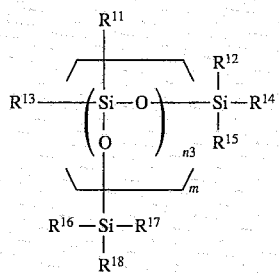

wherein $R^{11}$, $R^{12}$, $R^{13}$, $R^{14}$, $R^{15}$, $R^{16}$, $R^{17}$, and $R^{18}$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^{11}$, $R^{12}$, $R^{13}$, $R^{14}$, $R^{15}$, $R^{16}$, $R^{17}$, and $R^{18}$ is a lower alkoxyl group having 1 to 5 carbon atoms; and n3 and m are independently integers of 1 or more;

exposing a portion of said resist film to light or radiation, thereby causing said polymer to undergo a polymerization reaction; and developing said resist film by the use of an alkali developer.

6. A method for preparing a photomask, comprising the steps of:

applying a light non-transmissive pattern on a surface of a substrate;

applying a composition over the surface of said substrate with said light non-transmissive pattern to form a resist film, wherein said composition has sensitivity to light or radiation, and consists essentially of a polymer having a siloxane-bond structure, said polymer having a structure selected from the group of structures represented by the following general formula:

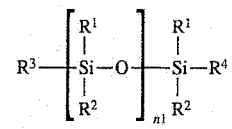

wherein $R^1$, $R^2$, $R^3$, and $R^4$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^3$ and $R^4$ is a lower alkoxyl group having 1 to 5 carbon atoms; and n1 is an integer of 1 or more;

exposing a portion of said resist film to light or radiation, thereby causing said polymer to undergo a polymerization reaction; and developing said resist film by the use of a developer, resulting in a phase shifter.

7. A method of claim 6, which further comprises the step of subjecting the phase shifter to a heating treatment to complete a polymerization reaction of the polymer contained in the composition.

8. A method for preparing a photomask, comprising the steps of:

applying a light non-transmissive pattern on a surface of a substrate;

applying a composition over the surface of said substrate with said light non-transmissive pattern to form a resist film, wherein said composition has sensitivity to light or radiation, and consists essentially of a polymer having a siloxane-bond structure, said polymer having a structure selected from the group of structures represented by the following general formula:

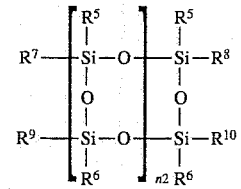

wherein $R^5$, $R^6$, $R^7$, $R^8$, $R^9$, and $R^{10}$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^7$, $R^8$, $R^9$, and $R^{10}$ is a lower alkoxyl group having 1 to 5 carbon atoms; and n2 is an integer of 1 or more;

exposing a portion of said resist film to light or radiation, thereby causing said polymer to undergo a polymerization reaction; and developing said resist film by the use of a developer, resulting in a phase shifter.

9. A method of claim 8, which further comprises the step of subjecting the phase shifter to a heating treatment to complete a polymerization reaction of the polymer contained in the composition.

10. A method for preparing a photomask, comprising the steps of:

applying a light non-transmissive pattern on a surface of a substrate;

applying a composition over the surface of said substrate with said light non-transmissive pattern to form a resist film, wherein said composition has sensitivity to light or radiation, and consists essentially of a polymer having a siloxane-bond structure, said polymer having a structure selected from the group of structures represented by the following general formula:

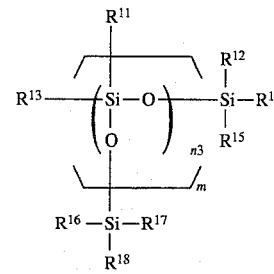

wherein $R^{11}$, $R^{12}$, $R^{13}$, $R^{14}$, $R^{15}$, $R^{16}$, $R^{17}$, and $R^{18}$ are independently a hydrogen atom, a hydroxyl group, a lower alkyl group having 1 to 5 carbon atoms, a lower alkoxyl group having 1 to 5 carbon atoms; or a trialkylsilyl group; at least one group selected from the group consisting of $R^{11}$, $R^{12}$, $R^{13}$, $R^{14}$, $R^{15}$, $R^{16}$, $R^{17}$, and $R^{18}$ is a lower alkoxyl group having 1 to 5 carbon atoms; and n3 and m are independently integers of 1 or more;

exposing a portion of said resist film to light or radiation, thereby causing said polymer to undergo a polymerization reaction; and developing said resist film by the use of a developer, resulting in a phase shifter.

11. A method of claim 10, which further comprises the step of subjecting the phase shifter to a heating treatment to complete a polymerization reaction of the polymer contained in the composition.

12. A method for preparing semiconductor devices comprising the steps of:

forming a semiconductor element on a surface of a substrate;

forming a plurality of bonding pads on part of the substrate;

forming a protective film to cover the surface of the substrate;

subjecting the protective film to an etching treatment to form windows on the portions of the protective film facing the individual bonding pads;

applying a composition to the protective film including the bonding pads, resulting in a resist film, wherein said composition has sensitivity to light or radiation, and consists essentially of a polymer having a siloxane-bond structure and having at least one end group or a side chain group, and a sensitizing agent, each of said end group and said side chain group is a functional group which causes condensation polymerization upon exposure to acid;

exposing said resist film to light or radiation, thereby causing said sensitizing agent to produce an acid which causes condensation polymerization at said end group or said side chain group of said polymer;

developing said resist film by the use of a developer; and connecting the individual bonding pads to wires.

13. A method for preparing semiconductor devices comprising the steps of:

forming a semiconductor element on a surface of a substrate;

forming a plurality of bonding pads on part of the substrate;

forming a protective film to cover the surface of the substrate;

subjecting the protective film to an etching treatment to form windows on the portions of the protective film facing the individual bondings pads;

applying a composition to the protective film including the bonding pads, resulting in a resist film, wherein said composition has sensitivity to light or radiation, and consists essentially of a polymer having a siloxane-bond structure and having at least one end group or a side chain group, a sensitizing agent, and a dye having high solubility in a polar solvent, each of said end group and said side chain group is a functional group which causes condensation polymerization upon exposure to acid;

exposing said resist film to light or radiation, thereby causing said sensitizing agent to produce an acid which causes condensation polymerization at said end group or said side chain group of said polymer;

developing said resist film by the use of a developer; and connecting the individual bonding pads to wires.

14. A method for preparing semiconductor devices comprising the steps of:

forming a semiconductor element on a surface of a substrate;

forming a plurality of bonding pads on part of the substrate;

forming a protective film to cover the surface of the substrate;

subjecting the protective film to an etching treatment to form windows on the portions of the protective film facing the individual bonding pads;

applying a composition to the protective film including the bonding pads, resulting in a resist film, wherein said composition has sensitivity to light or radiation, and consists essentially of a polymer having a siloxane-bond structure and a sensitizing agent, said polymer having a structure selected from the group of structures represented by the following general formula:

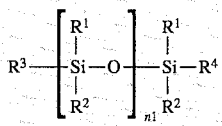

wherein $R^1$, $R^2$, $R^3$, $R^4$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^3$ and $R^4$ is a lower alkoxyl group having 1 to 5 carbon atoms; and n1 is an integer of 1 or more;

exposing said resist film to light or radiation, thereby causing said polymer to undergo a polymerization reaction;

developing said resist film by the use a developer; and connecting the individual bonding pads to wires.

15. A method for preparing semiconductor devices comprising the steps of:

forming a semiconductor element on a surface of a substrate;

forming a plurality of bonding pads on part of the substrate;

forming a protective film to cover the surface of the substrate;

subjecting the protective film to an etching treatment to form windows on the portions of the protective film facing the individual bonding pads;

applying a composition to the protective film including the bonding pads, resulting in a resist film, wherein said composition has sensitivity to light or radiation, and consists essentially of a polymer having a siloxane-bond structure and a sensitizing agent, said polymer having a structure selected from the group of structures represented by the following general formula:

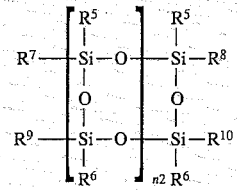

wherein $R^5$, $R^6$, $R^7$, $R^8$, $R^9$, and $R^{10}$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^7$, $R^8$, $R^9$, and $R^{10}$ is a lower alkoxyl group having 1 to 5 carbon atoms; and n2 is an integer of 1 or more;

exposing said resist film to light or radiation, thereby causing said polymer to undergo a polymerization reaction;

developing said resist film by the use a developer; and connecting the individual bonding pads to wires.

16. A method for preparing semiconductor devices comprising the steps of:

forming a semiconductor element on a surface of a substrate;

forming a plurality of bonding pads on part of the substrate;

forming a protective film to cover the surface of the substrate;

subjecting the protective film to an etching treatment to form windows on the portions of the protective film facing the individual bonding pads;

applying a composition to the protective film including the bonding pads, resulting in a resist film, wherein said composition has sensitivity to light or radiation, and consists essentially of a polymer having a siloxane-bond structure and a sensitizing agent, said polymer having a structure selected from the group of structures represented by the following general formula:

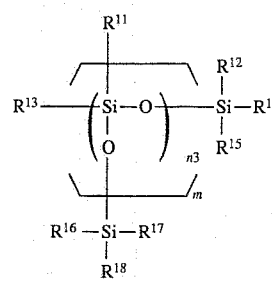

wherein $R^{11}$, $R^{12}$, $R^{13}$, $R^{14}$, $R^{15}$, $R^{16}$, $R^{17}$, and $R^{18}$ are independently a hydrogen atom, a hydroxyl group, a lower alkyl group having 1 to 5 carbon atoms, a lower alkoxyl group having 1 to 5 carbon atoms, or a trialkylsilyl group; at least one group selected from the group consisting of $R^{11}$, $R^{12}$, $R^{13}$, $R^{14}$, $R^{15}$, $R^{16}$, $R^{17}$, and $R^{18}$ is a lower alkoxyl group having 1 to 5 carbon atoms; and n3 and m are independently integers of 1 or more;

exposing said resist film to light or radiation, thereby causing said polymer to undergo a polymerization reaction;

developing said resist film by the use of a developer; and connecting the individual bonding pads to wires.

* * * * *

UNITED STATES PATENT AND TRADE MARK OFFICE
CERTIFICATE OF CORRECTION

PATENT NO. : 5,554,465
DATED : September 10, 1996
INVENTOR(S) : Watanabe

It is certified that error appears in the above-identified patent and that said Letters Patent is hereby corrected as shown below:

On the cover page, item [56] References Cited, U.S. Patent Documents, cite the following: 4,600,685 7/1986 Kitakohji et al.

Column 1, line 36, delete "compose" and insert therefor --composed--.

Column 3, lines 10-11, page, should read --pages--. 73, vol. 539--.

Column 3, line 21, delete "903-913" and insert therefor --909-913--.

Column 3, line 31, delete "192-294" and insert therefor --291-294--.

Column 9, line 63, delete "Onium salt" and insert therefor --(1) Onium salt--.

Column 10, line 10, delete "$ArN2^{+x-}$" and insert therefor --$ArN_2^+X^-$--

Column 10, line 32, delete "Aromatic ketone".

Column 13, line 2, delete "3,230" and insert therefor --3,320--.

Column 15, line 58, insert --EXAMPLE 2--.

Column 15, line 63, delete "fluoroantimonate" and insert therefor --triflate--.

Column 15, line 64, delete "$C_{28}H_{18}$" and insert --$C_{20}H_{12}$--

UNITED STATES PATENT AND TRADE MARK OFFICE
CERTIFICATE OF CORRECTION

PATENT NO. : 5,554,465
DATED : September 10, 1996
INVENTOR(S) : Watanabe

It is certified that error appears in the above-identified patent and that said Letters Patent is hereby corrected as shown below:

Column 16, lines 49-50, delete "end shown in FIG. 7(a) group" and insert therefor --end group shown in FIG. 7(a)--.

Column 18, line 30, delete "silicone" and insert therefor --silicon--.

Column 22, line 63, delete "provide" and insert therefor --produce--.

Column 27, line 51, between "$R^3$," and "$R^4$" insert --and--.

Column 27, line 61, between the words "use" and "a" insert --of--.

Column 28, line 43, between the words "use" and "a" insert --of--.

Signed and Sealed this

Twentieth Day of May, 1997

BRUCE LEHMAN

*Attest:*

*Attesting Officer*     Commissioner of Patents and Trademarks

UNITED STATES PATENT AND TRADE MARK OFFICE
CERTIFICATE OF CORRECTION

Figure 16A:
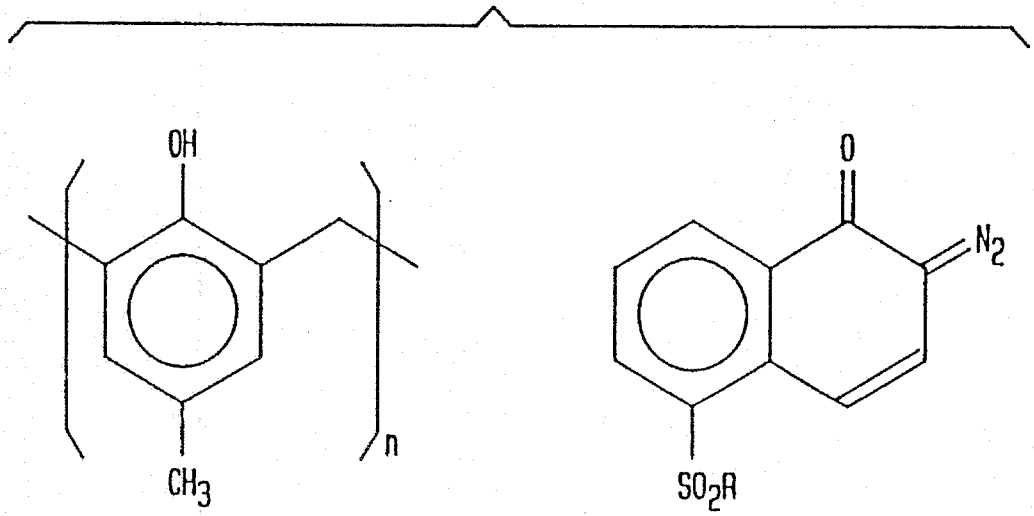
FIGS. 16(a) and 16(b) show diagrams representing the structures of conventional resist materials.
Figure 16B:
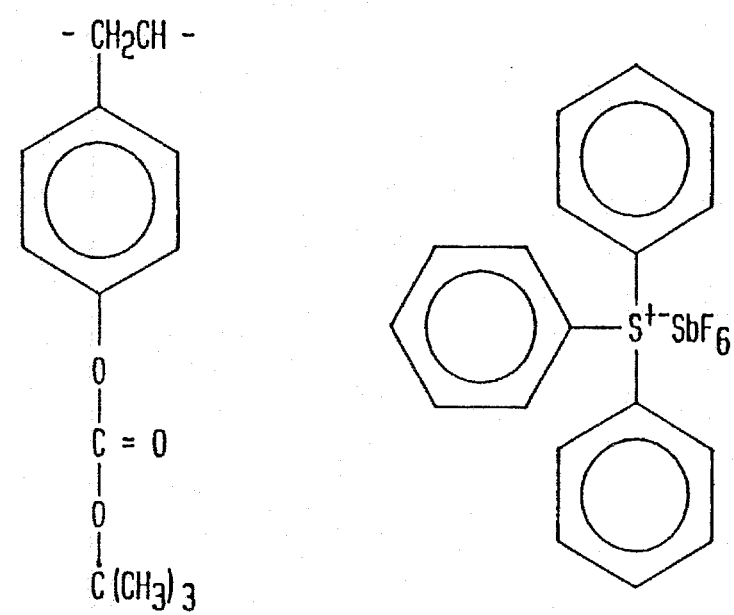
Figure 17A:
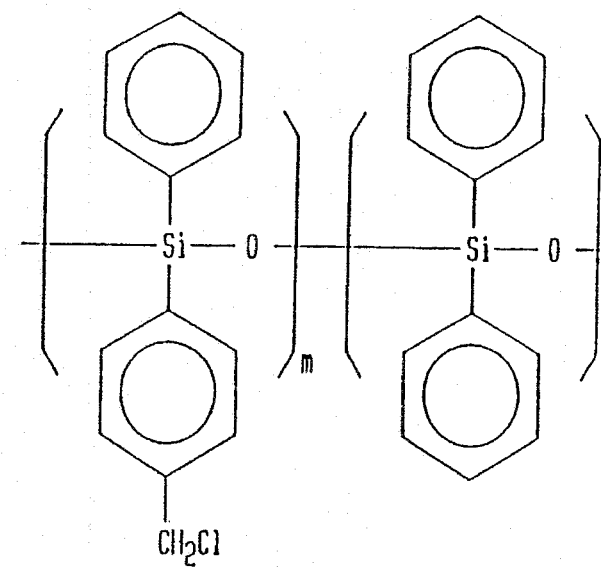
FIGS. 17(a)–17(f) show diagrams representing the structures of the other conventional resist materials.
Figure 17B:
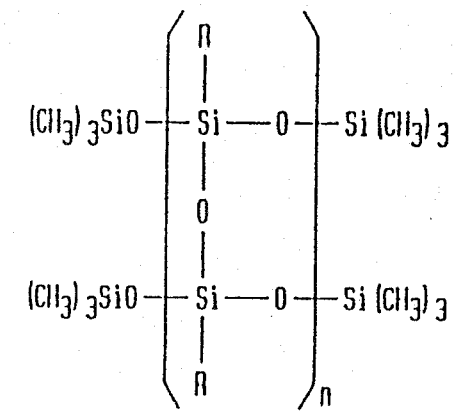
Figure 17C:
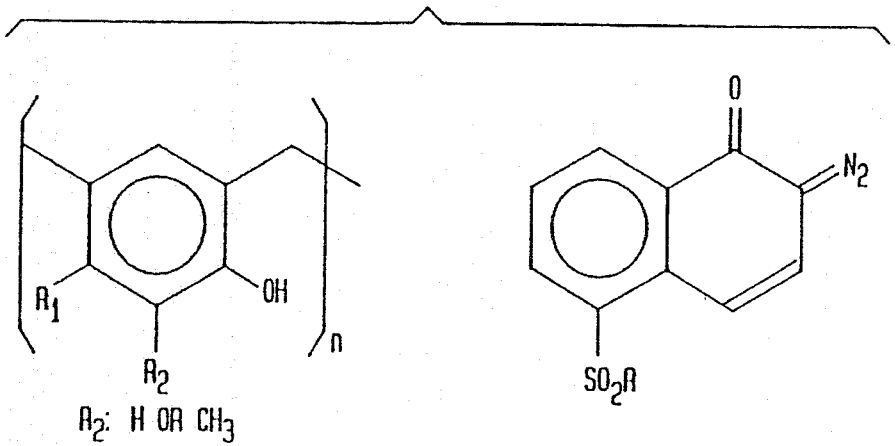
Figure 17D:
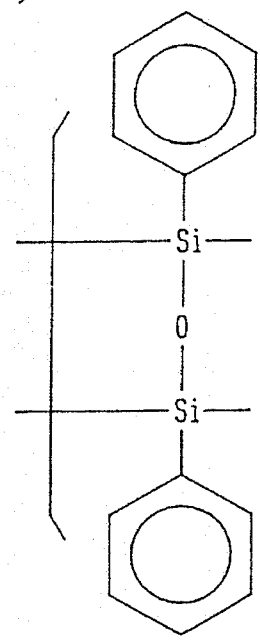
Figure 17D:
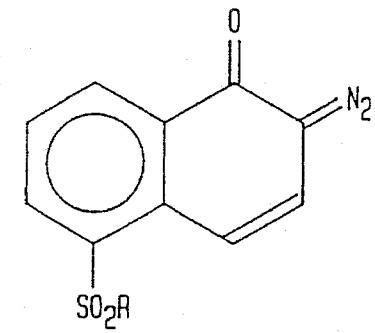
Figure 17E:
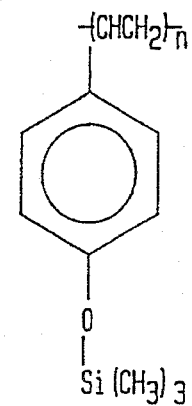
Figure 17E:
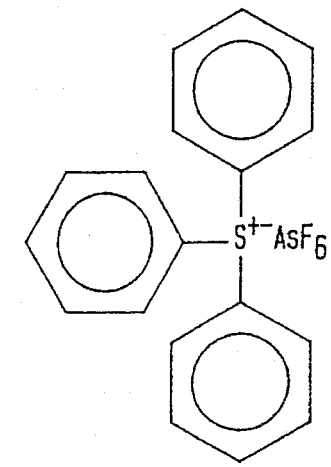
Figure 17F:
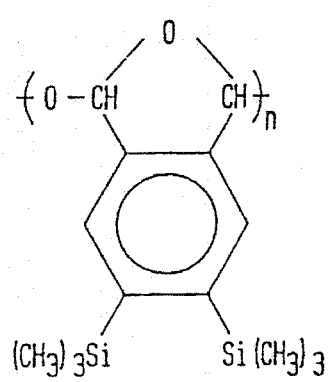
Figure 17F:
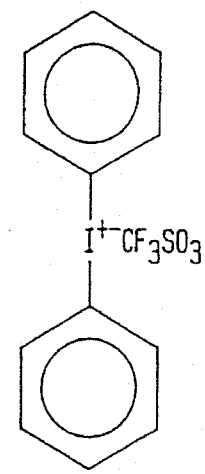

PATENT NO.   : 5,554,465
DATED        : September 10, 1996
INVENTOR(S)  : Watanabe It is certified that error appears in the above-identified patent and that said Letters Patent is hereby corrected as shown below:

Column 3, line 57, delete "FIG.16(e)" and insert therefor --FIG. 17(e)--.

Signed and Sealed this

Thirty-first Day of March, 1998

Attest:

BRUCE LEHMAN

Attesting Officer       *Commissioner of Patents and Trademarks*